(12) United States Patent
Sugawara

(10) Patent No.: US 6,590,701 B2
(45) Date of Patent: Jul. 8, 2003

(54) OPTICAL SIGNAL PROCESSING METHOD AND APPARATUS

(75) Inventor: Mitsuru Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 18 days.

(21) Appl. No.: 10/004,804

(22) Filed: Dec. 7, 2001

(65) Prior Publication Data

US 2002/0171920 A1 Nov. 21, 2002

(30) Foreign Application Priority Data

May 11, 2001 (JP) ...................................... 2001-142386

(51) Int. Cl.[7] ................................................ H01S 3/00
(52) U.S. Cl. ........................................ 359/344; 372/43
(58) Field of Search ............................ 359/344; 372/43

(56) References Cited

U.S. PATENT DOCUMENTS 5,354,707 A * 10/1994 Chapple-Sokol et al. ... 437/106
6,507,042 B1 * 1/2003 Mukai et al. ................. 257/14

FOREIGN PATENT DOCUMENTS

JP 411307860 A * 11/1999
JP 02000275692 A * 10/2000

OTHER PUBLICATIONS

Borri et al, "Ultrafast dynamic In InAs/GaAs quantum dot amplifiers" 1999; CLEO'99, pp 321–322.*

* cited by examiner

*Primary Examiner*—Mark Hellner
(74) *Attorney, Agent, or Firm*—Armstrong, Westerman & Hattori, LLP

(57) ABSTRACT

Carriers are injected into a plurality of quantum dots by applying a bias voltage to a semiconductor region of a semiconductor optical amplifier, the plurality of quantum dots for three-dimensionally confining carriers being distributed in the semiconductor region. An optical pulse signal at a bit rate of 2 Gb/s or higher is input to the semiconductor optical amplifier which amplifies the input optical pulse signal by generating induced emission by optical transition of the carriers in the quantum dots. An optical signal processing method capable of high speed and stable operation is provided.

10 Claims, 21 Drawing Sheets

SEMICONDUCTOR OPTICAL AMPLIFIER OF 1ST EMBODIMENT

CONVENTIONAL SEMICONDUCTOR OPTICAL AMPLIFIER

STEADY STATE

OPTICAL PULSE INCIDENCE

OPTICAL PULSE TRANSMISSION COMPLETION

RECOVERY

OPTICAL SIGNAL PROCESSING METHOD AND APPARATUS

CROSS REFERENCE TO RELATED APPLICATION

This application is based on Japanese patent application 2001-142386, filed on May 11, 2001, the whole contents of which are incorporated herein by reference.

BACKGROUND OF THE INVENTION

1) Field of the Invention

The present invention relates to a semiconductor optical amplifier and an optical signal processing apparatus, and more particularly to a semiconductor optical amplifier and an optical signal processing apparatus suitable for long-distance and broadband optical transmission and capable of high-speed operation.

2) Description of the Related Art

Wavelength division multiplexing (WDM) techniques have been developed recently as an optical transmission method to be used in a broadband optical network. Optical time division multiplexing (OTDM) techniques aiming at broadband optical transmission and time wavelength division multiplexing (TWDM) techniques combining WDM techniques and OTDM techniques have been proposed and are now under researches.

FIG. 1 is a conceptual diagram showing a broadband optical network. A plurality of nodes 1 are interconnected by optical channels (optical fibers) 2. Each node 1 performs optical signal regeneration, drop, add and routing. The optical signal regeneration is generally realized by the functions of amplifying, reshaping and retiming, and is called 3R regeneration.

In a conventional optical transmission method, each node converts once an optical signal into an electric signal, performs signal processing depending upon the state of the electric signal, and reconverts the processed electric signal into an optical signal. However, a response speed of an electric signal is lower than that of an optical signal because the response time is limited by the carrier mobility and CR time constants of electronic components. For example, the speed limit of signal processing using the method of converting an optical signal into an electric signal is 10 to 40 Gb/s. In order to perform signal processing at a speed higher than 10 to 40 Gb/s, it is essential to incorporate overall optical signal processing techniques by which an OTDM signal is processed always in the form of light.

FIG. 2 is a block diagram showing the structure of an optical node at which an OTDM signal is processed in the form of light. An optical node 1 is constituted of a regeneration function block 5, a drop function block 10, an add function block 20 and a routing function block 25.

An optical signal made of a plurality of time-division multiplex channels is input to an amplifier 6 of the regeneration function block 5. The amplifier 6 amplifies the optical signal. A reshaper 7 reshapes the waveform of the amplified optical signal. A retiming unit 8 corrects the time shifts of pulses of the waveform reshaped optical signal to recover regular positions of the pulses on the time axis. A clock sampler 9 samples a clock signal from the amplified optical signal and supplies the clock signal to each unit of the optical node.

The optical signal subjected to the retiming process is input to a pulse branching unit 11 in the drop function block 10 and to an optical gate 21 in the add function block 20. The optical signal branched by the pulse branching unit 11 is input to a header reader 12 and a delay memory 13. The header reader 12 reads header information of the optical signal for each channel. The delay memory 13 delays the optical signal by a predetermined time. A demultiplexer 14 demultiplexes the delayed optical signal of each channel to pick up the optical signal corresponding to the channels to be dropped at the node.

The optical gate 21 in the add function block 20 sets an empty state to a time slot of each channel dropped at the node from the optical signal subjected to the retiming process. A multiplexer 22 multiplexes an optical signal to be added at the node. The multiplex optical signal is added to the empty time slot of the optical signal passing through the optical gate 21. A header former 23 forms a header of the optical signal added at the node, and adds the header information to a predetermined time slot of the optical signal passing through the optical gate 21.

The optical signal added with the header information is input to a wavelength converter 24 and to the routing function block 25. The wavelength converter 24 converts the wavelength of the input optical signal, and inputs the wavelength converted optical signal to the routing function block 25. The routing function block 25 distributes the optical signal of each channel to the next node in accordance with the routing information of the input optical signal of each channel.

Among those elements realizing the above-described functions of the optical node, it is desired to realize an element having the two functions of the optical amplifier 6 and waveform reshaper 7 (the element having the two functions is called a 2R element) and the elements having the functions of the optical demultiplexer 14 for demultiplexing the optical signal of a plurality of time-division multiplex channels and the wavelength converter 24.

Such functions can be realized by a semiconductor optical amplifier (SOA).

FIG. 15 is a perspective view showing the outline of a conventional SOA. This SOA has the structure that an active layer 200 having an optical amplification gain is sandwiched between a p-type semiconductor layer 201 and an n-type semiconductor layer 202. The active layer 200 is a quantum well layer or a semiconductor layer made of semiconductor having a band gap smaller than those of the semiconductor layers on both sides of the active layer 200.

As a forward bias is applied to the active layer 200, the carrier distribution in the active layer 200 becomes a reversed distribution state. As an optical signal 203 is incident upon the active layer 200 from one end thereof, the optical signal is amplified in the active layer 200 and outputs from the opposite end. Next, with reference to FIGS. 16 and 17, the operation principle of a semiconductor optical amplifier applied to an optical signal processing apparatus will be described.

FIG. 16 illustrates a semiconductor optical amplifier operating as a 2R element. A long-distance-transmitted optical signal is input to the semiconductor optical amplifier 210. The pulse intensities of an optical signal are irregular because of various factors during transmission, such as generation of noises, external disturbance of a transmission system, and branch. The optical intensity relation between input and output signals of the semiconductor optical amplifier 210 has saturation characteristics. This is called gain saturation.

If the optical signal having irregular pulse intensities is input to the semiconductor optical amplifier 210 having such gain saturation, the optical signal is amplified and the pulse intensities of the output signal become approximately uniform. Namely, the semiconductor optical amplifier 210 has the functions of optical amplifying and waveform reshaping.

FIG. 17 illustrates an operation of a semiconductor optical amplifier as a wavelength converter. An optical signal $sig_1$ having a wavelength $\lambda_1$ and an optical signal $sig_2$ having a wavelength $\lambda_2$ are input to the semiconductor optical amplifier 210. The optical signal $sig_1$ is an optical pulse train and the optical signal $sig_2$ is continuous light. The intensities of the optical signals and the amplification characteristics of the semiconductor optical amplifier 210 are adjusted so that the gain of the semiconductor optical amplifier 210 saturates when both the optical signals $sig_1$ and $sig_2$ are input.

Since the on-pulse and off-pulse of the optical signal $sig_1$ change the gain of the optical signal $sig_2$, the intensity of the optical signal $sig_2$ is modulated. Therefore, the optical signal $sig_2$ having the wavelength $\lambda_2$ output from the semiconductor optical amplifier 210 has the inverted waveform of the input optical signal $sig_1$. Namely, it means that the optical signal $sig_1$ having the wavelength $\lambda_1$ is converted into the optical signal $sig_2$ having the wavelength $\lambda_2$.

As described above, a semiconductor optical amplifier can be used as a 2R element or a wavelength converter. However, the conventional semiconductor optical amplifier has a low response speed and the processible frequency is about 1 Gb/s at most. The reason for this will be described in the following.

The rate equation of an optical pulse $S(z, T)$ propagating in a semiconductor optical amplifier is represented by:

$$\frac{\partial S(z, T)}{\partial z} = (\Gamma g - \alpha_{loss})S(z, T) \quad (1)$$

where z is the coordinate value of a propagation direction of light in the optical wave guide of a semiconductor optical amplifier, T is time, g is a gain of the active layer of the semiconductor optical amplifier, $\alpha_{loss}$ is a loss in the optical wave guide, and $\Gamma$ is a light confinement coefficient. The gain g of the active layer is determined by the carrier density. The rate equation of a carrier density N is given by:

$$\frac{dN}{dT} = \frac{N_0 - N}{\tau_r} - \Gamma S(z, T)g \quad (2)$$

$$N_0 = \frac{\tau_r J}{ed}$$

where $\tau_r$ is a recombination time of carriers, J is a current density, d is a thickness of the active layer, and e is an electron charge. According to the evaluation experiments made by the present inventor, the gain g can be approximated to:

$$g = A(L-L_z)^2 + B(L-L_z)^3 \quad (3)$$

where L is a length of the semiconductor optical amplifier and each constant is defined as in the following:

$A=3P/(L_z-L_p)^2$ $B=2P/(L_z-L_p)^3$ $L_z=L_{zo}-C_0(N-N_0)$ $L_p=L_0-B_0(N-N_0)$ $P=A_0(N-N_0)+A_0N_0 exp(-N/N_0)$ $A_0=3.0\times10^{-16} [cm^2]$ $B_0=3.0\times10^{-20} [\mu m \cdot cm^3]$ $C_0=-3.0\times10^{-21} [\mu m \cdot cm^3]$ $L_{zo}=1.65 [\mu m]$ $L_0=1.60 [\mu m]$ $N_0=7.0\times10^{17} [cm^{-3}] \quad (4)$ By substituting the equation (3) into the equation (2), a differential equation of the carrier density N can be obtained. By solving this differential equation, a graph of the carrier density N changing with time can be obtained. By substituting the carrier density N changing with time into the equation (3), a graph of the gain g changing with time can be obtained.

FIG. 18 shows the calculation results of changes in the gain g with time after an optical pulse having a pulse width of 10 ps is input to a semiconductor optical amplifier starting from time 0. The abscissa represents a lapse time after the time 0 in the unit of "ps", and the ordinate represents the gain g in the unit of $cm^{-1}$. The active layer of the semiconductor optical amplifier used for evaluation was made of InGaAsP corresponding to a band gap of 1.55 $\mu m$ and an operation temperature was 295 K. In FIG. 18, the gains g are shown at the current densities in the semiconductor optical amplifier of 4 k/cm², 8 k/cm² and 16 kA/cm². While the optical pulse is input, the gain g lowers because the carrier density is lowered by optical transition of electrons in the conduction band.

FIG. 19 shows a change in the gain g with time after an optical pulse having a pulse width of 10 ps is input to a semiconductor optical amplifier at a bit rate of 40 Gb/s. The abscissa represents a lapse time in the unit of "ns", and the ordinate represents the gain g in the unit of $cm^{-1}$. The structure of the active layer and the operation temperature were the same as those in the case of FIG. 18. The current density is 8 kA/cm². While the optical pulse is input, the gain g lowers. During the period while the optical pulse is not input, the gain g increases because carriers are supplied to the active layer.

It can be seen from this graph that the gain change cannot follow the optical signal of 40 Gb/s because of a low response speed of the gain. It can be seen from the graph of FIG. 19 that the response time of the gain g is about 0.3 ns. It can be understood from this response time that the operation frequency of a conventional semiconductor optical amplifier is 2 Gb/s at most.

FIG. 20 shows the light intensities of input and output signals when an optical signal having a pulse width of 10 ps is input to a conventional semiconductor optical amplifier at a bit speed of 40 Gb/s. The abscissa represents a lapse time in the unit of "ps", and the ordinate represents the optical output in the unit of "mW". The structure of the semiconductor optical amplifier was similar to that of FIG. 18, the current density was 8 kA/cm², the operation temperature was 295 K, and the active layer length was 600 $\mu m$. Since the response characteristics of the gain are poor, the peak power of each pulse of the output signal gradually lowers and it takes a long time for the peak power to become constant. Such a change in the peak power may cause a transmission error.

Next, with reference to FIGS. 21A and 21B, the operation principle and an example of structure of an optical signal separator unit (demultiplexer) using a conventional semiconductor optical amplifier will be described.

As shown in FIG. 21A, an optical control signal $sig_3$ and an optical signal $sig_4$ are input to a semiconductor optical amplifier 210. For example, the optical signal $sig_4$ is a signal of time-division multiplex channels #1 to #4. A pulse of the optical control signal $sig_3$ is input to the semiconductor optical amplifier 210 synchronously with the time slot of the channel #2 of the optical signal $sig_4$.

As the pulse of the control signal $sig_3$ is superposed upon the pulse of the optical signal $sig_4$, the carrier density of the active layer of the semiconductor optical amplifier 210 lowers greatly and the refraction factor changes. Therefore, the phase of the pulse of the channel #2 of the optical signal $sig_4$ changes. In FIG. 21A, the pulses having the changed phase are shown hatched. The semiconductor optical amplifier 210 is adjusted so that the phase change becomes just $\pi$.

Since the response characteristics of a semiconductor optical amplifier are poor, the pulse of the control signal $sig_3$ input synchronously with the time slot of the channel #2 of the optical signal $sig_4$ also influences the time slots of the channels #3 and #4 of the optical signal $sig_4$. From this reason, the phases of the pulses of the channels #3 and #4 are also changed.

FIG. 21B shows an example of the structure of an optical signal separator capable of solving the above-described problem. A first semiconductor optical amplifier 210A is inserted into one optical path of a Mach-Zehnder type interferometer, and a second semiconductor optical amplifier 210B is inserted into the other optical path. An optical signal $sig_4$ obtained by time-division multiplexing four channels is input to both the semiconductor optical amplifiers 210A and 210B.

An optical control signal $sig_3$ is input to the first semiconductor optical amplifier 210A, and a delayed optical control signal $sig_3$ is input to the second semiconductor optical amplifier 210B. The control signal $sig_3$ input to the first semiconductor optical amplifier 210A has a pulse corresponding in time to the time slot of the channel #2 of the optical signal $sig_4$. The optical signal $sig_3$ input to the second semiconductor optical amplifier 210B was delayed and corresponds in time to the time slot of the channel #3 of the optical signal $sig_4$.

In the first semiconductor optical amplifier 210A, since the pulse of the control signal $sig_3$ influences the pulses of the channels #2 to #4, the phases of the pulses of the channels #2 to #4 of an output optical signal $sig_5$ change. In the second semiconductor optical amplifier 210B, the pulse of the control signal $sig_3$ influences the pulses of the channels #3 and #4, the phases of the pulses of the channels #3 and #4 of an output optical signal $sig_6$ change. In FIG. 21B, the pulses having the changed phases are shown hatched.

Since the optical signals sig5 and $sig_6$ interfere with each other, the pulses of the channels #1, #3 and #4 are output from one output optical wave guide 211A of the Mach-Zehnder type interferometer, and the pulse of the channel #2 is output from the other output optical wave guide 211B. In this manner, a signal of a desired channel can be separated from the time-division multiplex optical signal.

As described above, it is difficult for an optical signal processing apparatus using a conventional semiconductor optical amplifier to realize high speed transmission at about 2 Gb/s or higher.

In the optical signal separator unit shown in FIG. 21B, the control signal $sig_3$ is delayed and then input to the second semiconductor optical amplifier 210B to compensate for the poor response characteristics of the second semiconductor optical amplifier 210B. However, the optical signal separator unit using this compensation method has a complicated structure, requires a fine adjustment, and is difficult to perform a stable operation.

SUMMARY OF THE INVENTION

It is an object of the present invention to provide an optical signal processing method and an optical signal processing apparatus capable of performing a high speed and stable operation.

According to one aspect of the present invention, there is provided an optical signal processing method, comprising the steps of: injecting carriers into a plurality of quantum dots by applying a bias voltage to a semiconductor region of a semiconductor optical amplifier, the plurality of quantum dots for three-dimensionally confining carriers being distributed in the semiconductor region; and amplifying an optical pulse signal having a bit rate of 2 Gb/s or higher input to the semiconductor optical amplifier by generating induced emission by optical transition of the carriers in the quantum dots.

According to another aspect of the present invention, there is provided an optical signal processing method, comprising the steps of: injecting carriers into a plurality of quantum dots by applying a bias voltage to a semiconductor region of a semiconductor optical amplifier, the plurality of quantum dots for three-dimensionally confining carriers being distributed in the semiconductor region; and inputting an optical pulse signal having a first wavelength and continuous light having a second wavelength different from the first wavelength to the semiconductor optical amplifier, to make an output waveform of the continuous light change with a waveform of the optical pulse signal by lowering a gain of the semiconductor optical amplifier upon input of an optical pulse of the optical pulse signal.

According to another aspect of the present invention, there is provided an optical signal processing method, comprising the steps of: injecting carriers into a plurality of quantum dots by applying a bias voltage to semiconductor regions of first and second semiconductor optical amplifiers, the plurality of quantum dots for three-dimensionally confining carriers being distributed in each of the semiconductor regions; inputting same multiplex signals obtained by time-division multiplexing a plurality of optical pulse signals to both of the first and second semiconductor optical amplifiers and inputting an optical control signal only to the first semiconductor optical amplifier synchronously with a time slot corresponding to one the optical pulse signals constructing the multiplex signal; and making the multiplex signals output from the first and second semiconductor optical amplifiers interfere with each other to separate one optical signal from the multiplex signal.

By utilizing optical transition of carriers in quantum dots, a response speed of the semiconductor optical amplifier can be improved.

According to another aspect of the present invention, there is provided an optical signal processing apparatus comprising: a semiconductor optical amplifier having a semiconductor region, a plurality of quantum dots for three-dimensionally confining carriers being distributed in the semiconductor region; and an optical input device for inputting an optical pulse signal having a first wavelength and continuous light having a second wavelength different from the first wavelength, to said semiconductor optical amplifier.

When a pulse of the optical pulse signal having the first wavelength is input, a gain saturation occurs so that the gain of the continuous light having the second wavelength lowers. The output intensity of the optical signal having the second wavelength changes with the waveform of the optical pulse signal having the first wavelength. As a result, the first wavelength is converted into the second wavelength.

According to another aspect of the present invention, there is provided an optical signal processing apparatus, comprising: first and second semiconductor optical amplifiers each having a semiconductor region, a plurality of quantum dots for three-dimensionally confining carriers being distributed in the semiconductor region; a first optical unit for inputting same multiplex signals obtained by time-division multiplexing a plurality of optical pulse signals to both of the first and second semiconductor optical amplifiers; a second optical unit for inputting an optical control pulse signal only to the first semiconductor optical amplifier synchronously with a time slot corresponding to one of the optical pulse signals constructing the multiplex signal; and an interferometer for making multiplex signals output from the first and second semiconductor optical amplifiers interfere with each other to separate one of the optical pulse signals from the multiplex signal.

According to another aspect of the present invention, there is provided an optical signal processing apparatus, comprising: first and second semiconductor optical amplifiers each having a semiconductor region, a plurality of quantum dots for three-dimensionally confining carriers being distributed in the semiconductor region; a first optical unit for inputting an optical pulse signal to the first and second semiconductor optical amplifiers; a second optical unit for inputting an optical control pulse signal only to the first semiconductor optical amplifier; and an interferometer for making optical pulse signals output from the first and second semiconductor optical amplifiers interfere with each other to separate an optical pulse from the optical pulse signals, the optical pulse being synchronous with the optical control pulse signal.

By utilizing optical transition of carriers in quantum dots, a response speed of the semiconductor optical amplifier can be improved. It is therefore possible to change the phase of a pulse of a desired time slot, by inputting an optical control signal. Since the low response speed of the semiconductor optical amplifier is not necessary to be compensated, the optical control signal is not necessary to be input to the second semiconductor optical amplifier so that the apparatus structure can be simplified. Fine adjustment of an operation point is not necessary.

According to another aspect of the present invention, there is provided an optical signal processing apparatus comprising: an optical absorbing and saturating element for absorbing a component of incident light having an intensity equal to or lower than a threshold value and allowing a component through, having an intensity higher than the threshold value; a first optical unit for inputting an optical pulse signal to said optical absorbing and saturating element; and a semiconductor optical amplifier having a semiconductor region, an optical pulse signal output from said optical absorbing and saturating element is input to said semiconductor optical amplifier, and a plurality of quantum dots for three-dimensionally confining carriers being distributed in the semiconductor region.

The optical absorbing and saturating element can eliminate the background noises of incidence light. An S/N ratio of an amplified optical signal can be improved.

According to another aspect of the present invention, there is provided an optical signal processing apparatus comprising: a plurality of optical absorbing and saturating elements each for absorbing a component of incidence light having an intensity equal to or lower than a threshold value and allowing a component through, having an intensity higher than the threshold value; a plurality of semiconductor optical amplifiers each having a semiconductor region, a plurality of quantum dots for three-dimensionally confining carriers being distributed in the semiconductor region; and optical wave guides for connecting said plurality of optical absorbing and saturating elements and semiconductor optical amplifiers in tandem.

The waveform reshaping effects can be improved by connecting the plurality of optical absorbing and saturating elements and semiconductor optical amplifiers in tandem.

An optical signal processing apparatus having a high response speed can be obtained by applying a high speed semiconductor optical amplifier to an optical signal amplifying and reshaping unit, a wavelength converter unit or an optical signal separator unit.

DESCRIPTION OF THE PREFERRED EMBODIMENTS

Figure 1:
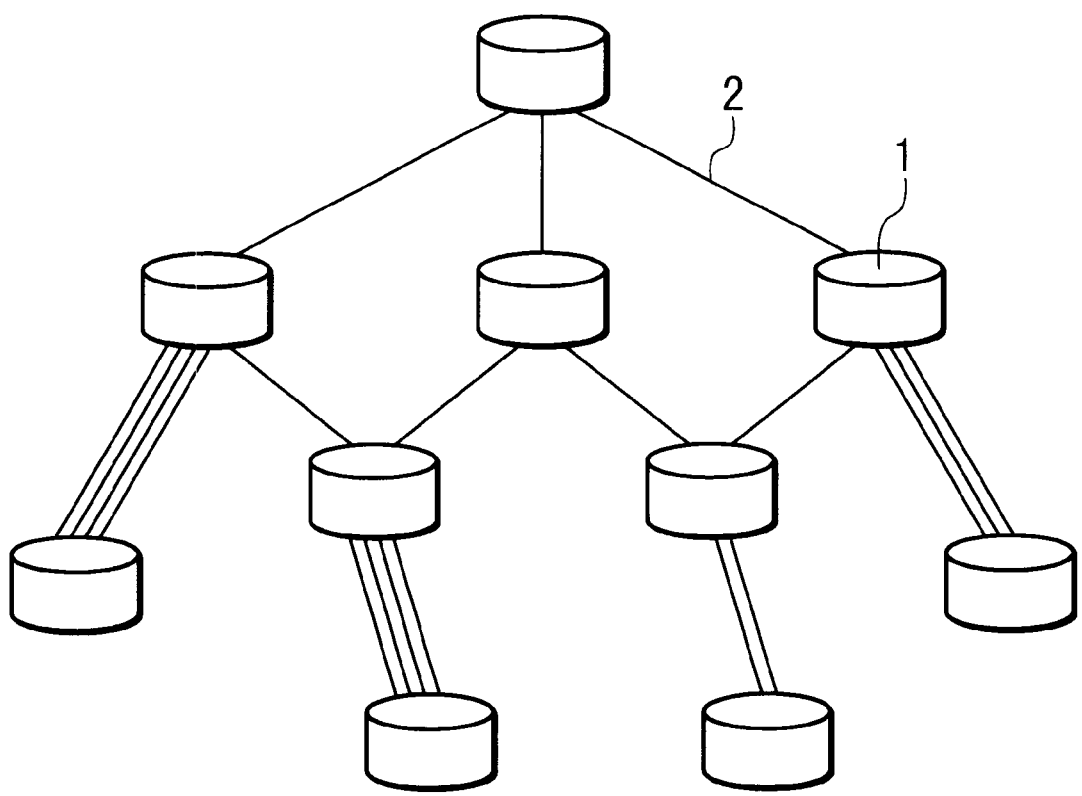
FIG. 1 is a conceptual diagram showing an optical network.
Figure 2:
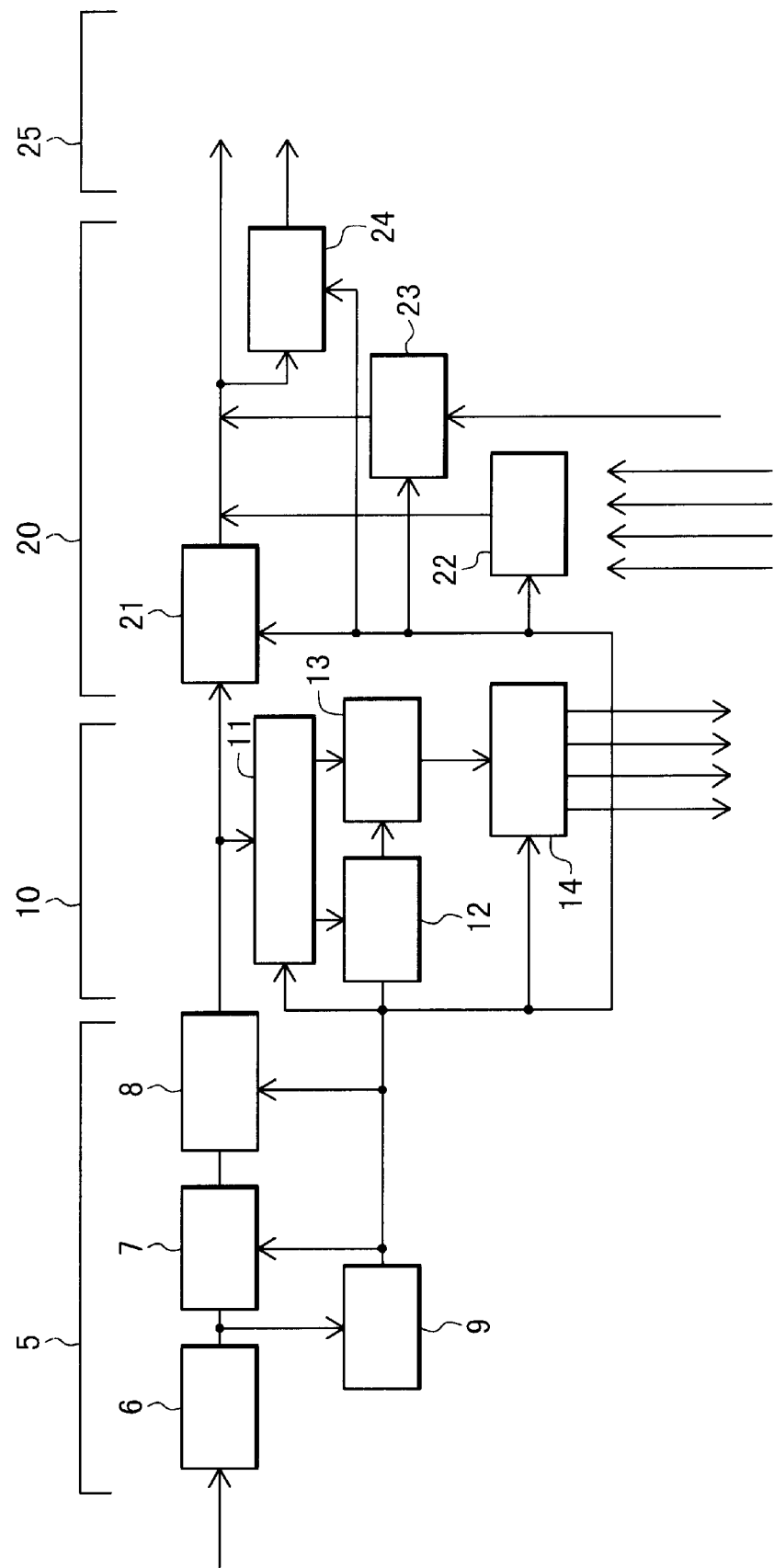
FIG. 2 is a functional block diagram of an optical node.
Figure 3:
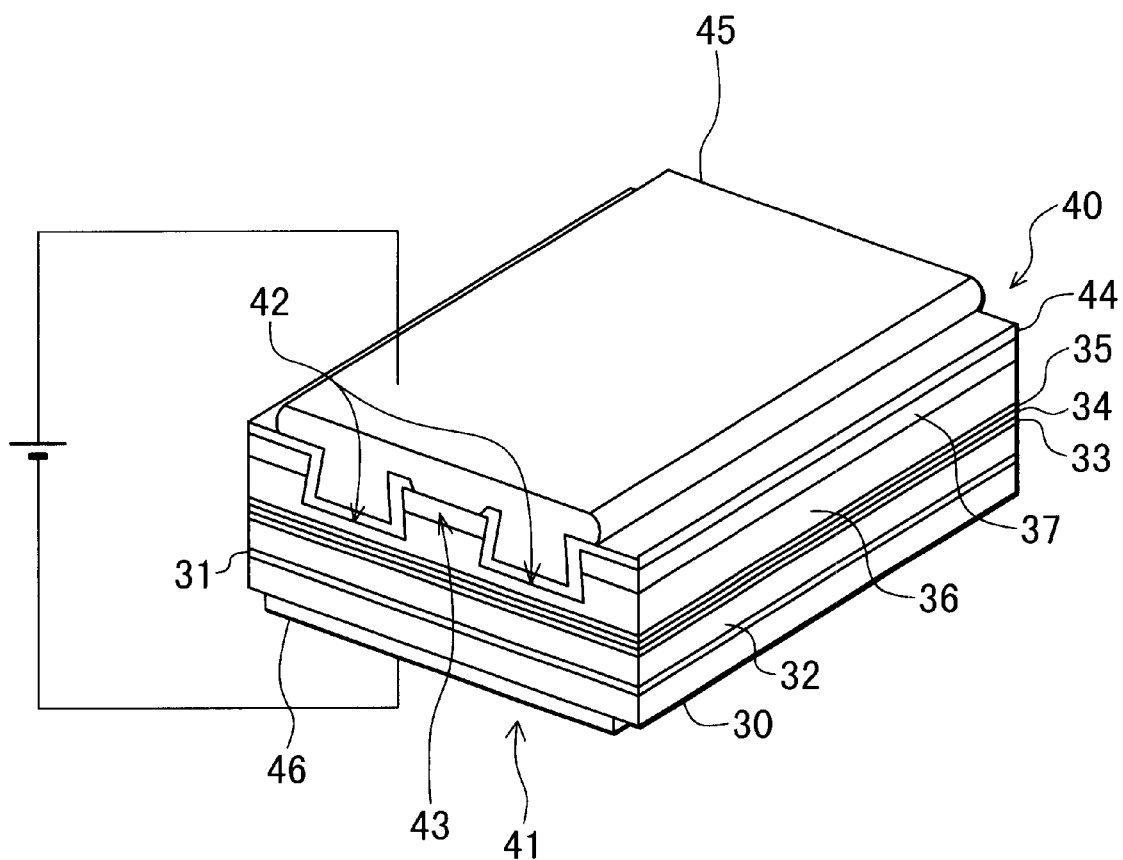
FIG. 3 is a perspective view of a semiconductor optical amplifier according to a first embodiment.

FIG. 3 is a perspective view of a semiconductor optical amplifier according to the first embodiment of the invention. On the surface of an n-type GaAs substrate 30 of 300 $\mu$m in thickness, a buffer layer 31 made of n-type GaAs of 1 $\mu$m in thickness is formed. On this buffer layer 31, a clad layer 32 made of n-type $Al_{0.4}Ga_{0.6}As$ of 0.5 $\mu$m in thickness is formed. On this clad layer 32, a lower light confinement layer 33, an active layer 34, and an upper light confinement layer 35 are laminated in this order. The details of the structure of these three layers will be given later with reference to FIG. 4A.

On the upper light confinement layer 35, a clad layer 36 made of p-type $Al_{0.4}Ga_{0.6}As$ of 1.0 $\mu$m in thickness is formed. On the clad layer 36, a contact layer 37 made of p-type GaAs of 0.2 $\mu$m in thickness is formed. The impurity concentrations of the n-type substrate 30, n-type clad layer 32, p-type clad layer 36, and p-type contact layer 37 are all about $1\times10^{18}$ cm$^{-3}$.

The lamination structure of these layers has generally a rectangular shape as viewed along a direction in parallel to the norm of the substrate surface. End face corresponding to one side of the rectangle defines an input end face 40, and the opposite side end face defines an output end face 41.

In the contact layer 37, two grooves 42 are formed extending from the input end face 40 to output end face 41. The two grooves 42 are disposed generally in parallel and reach the inside of the p-type clad layer 36. The two grooves 42 define a ridge 43 therebetween. An insulating film 44 made of silicon oxide covers the upper surface of the contact layer 37 and the inner surface of the grooves 42, excepting the upper surface of the ridge 43.

A p-side electrode 45 is formed on the upper surfaces of the insulating film 44 and ridge 43. For example, the p-side electrode 45 is made of AuZn alloy and ohmic-contacts the contact layer 37 at the upper surface of the ridge 43. An n-side electrode 46 is formed on the bottom surface of the n-type substrate 30. For example, the n-side electrode 46 is made of AuGe alloy and ohmic-contacts the substrate 30.

Figure 4A:
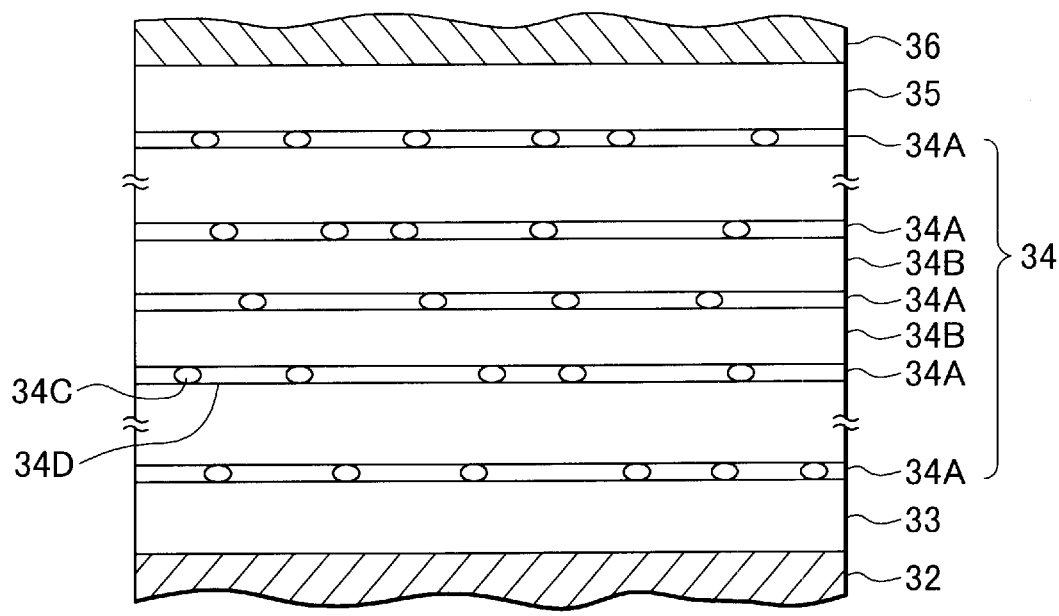
FIGS. 4A and 4B are a cross sectional view of an active layer of the semiconductor optical amplifier of the first embodiment, and an energy band diagram of a quantum dot layer.

FIG. 4A is a cross sectional view showing the lower light confinement layer 33, active layer 34 and upper light confinement layer 35. The lower and upper light confinement layers 33 and 35 are made of GaAs and have a thickness of 0.1 $\mu$m. The active layer 34 has a lamination structure of ten quantum dot layers 34A and nine GaAs layers 34B alternately stacked. The thickness of the quantum dot layer 34A is 25 $\mu$m and the thickness of the GaAs layer 34B is 25 nm.

Each quantum dot layer 34A is made of a number of quantum dots 34C and a wetting layer 34D. The quantum dots 34C are made of InAs and distributed irregularly on the surface of the underlying layer. The wetting layer 34D is made of InGaAs covering the underlying layer surface not disposed with the quantum dots 34C. The size of each quantum dot 34C in the in-plane direction is about 20 nm. The quantum dot 34C three-dimensionally confines carriers.

Next, a method of manufacturing the semiconductor optical amplifier shown in FIG. 3 will be described. Each of the layers from the clad layer 32 to contact layer 37 is formed by molecular beam epitaxy (MBE) at a growth temperature of 550° C. As InGaAs is grown on the surface of the underlying layer of GaAs, quantum dots 34C such as shown in FIG. 4A are formed by themselves so as to minimize strain energy.

The groove 42 is formed through etching by using, as etchant, mixture solution of phosphoric acid, hydrogen peroxide and water. The insulating film 44 is formed by chemical vapor deposition (CVD) or sputtering. The p- and n-side electrodes 45 and 46 are formed by vacuum evaporation.

Next, the operation principle of the semiconductor optical amplifier of the first embodiment shown in FIG. 3 will be described.

Figure 4B:
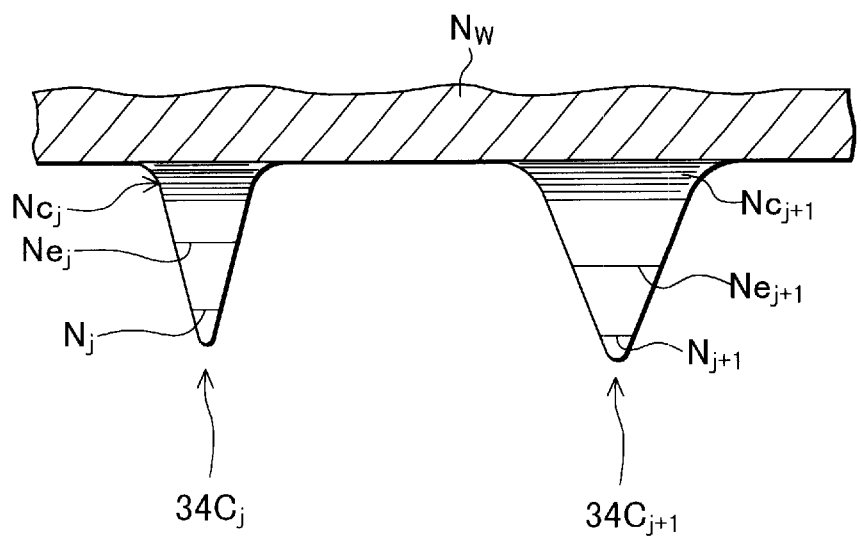

FIG. 4B is an energy band diagram of quantum dots 34C. In FIG. 4B, energy levels of a j-th quantum dot $34C_j$ and a (j+1)-th quantum dot $34C_{j+1}$ are shown. Since the size of the quantum dot 34C is approximately the same size as the wavelength of an electron in the conduction band, the energy of an electron in the quantum dot 34C is quantized. Therefore, the energy levels of an electron in the conduction band in the quantum dot $34C_j$ are distributed discretely. An energy difference between states of the secondary excitation state and higher excitation states is sufficiently smaller than the energy difference between the ground state $N_j$ and primary excitation state Ne(j) and the energy difference between the primary excitation state $Ne_j$ and secondary excitation state. A plurality of states of the secondary excitation state and higher excitation states can therefore be assumed to be a continuous state $Nc_j$. A continuous state Nw exists in the conduction band of the wetting layer 34D. The following studies take into consideration a variation (called inhomogeneous broadening) of sizes of quantum dots and a variation (called homogeneous broadening) of gains of quantum dots.

A gain G of the active layer 34 containing a number of quantum dots 34C is given by:

$$G = \sum_j g_j \quad (5)$$

where $g_j$ is a gain of a j-th quantum dot $34C_j$ and is give by the following equation:

$$g_j = A_j(N_j - N_D G_j) \quad (6)$$

$$A_j = 2\pi e^2/(\epsilon_o c n_r m_o^2) \times (|P|^2/E_0) \times B(\omega - \omega_j)$$

$$G_j = G(\omega_j - \omega_0)\Delta\omega$$

where $\epsilon_0$ is a dielectric constant of vacuum, c is a light velocity in vacuum, e is an electron charge, $n_r$ is an average refraction factor of light in the optical wave guide of the semiconductor optical amplifier, $m_0$ is a rest mass of an electron, P is a matrix element of optical transition of a quantum dot, and $E_0$ is an optical transition energy from the ground stats of a quantum dot to the ground level of the valence band. The angular frequency $\omega_0$ corresponding to the energy $E_0$ is given by:

$$\omega_0 = (2\pi)E_0/(h/2\pi) \quad (7)$$

where h is the Planck's constant. $G(\omega_j-\omega_0)$ is a distribution function of optical transition energies of quantum dots. A plurality of quantum dots are grouped in accordance with their optical transition energies, and the quantum dot is identified by an index j. $\Delta\omega$ is an angular frequency width of each group of grouped quantum dots.

As a forward bias is applied across the p-side electrode 45 and n-side electrode 46 shown in FIG. 3, carriers are injected into the active layer 34. Carriers are first injected into the wetting layer 34D surrounding the quantum dot 34C and then captured by the higher excitation state of the quantum dot 34C. A carrier captured by the j-th quantum dot 34C$_j$ is relaxed to the excitation state Ne$_j$ and to the ground state N$_j$.

In the energy level model shown in FIG. 4B, the injection process of a carrier into the quantum dot 34C can be expressed by the following rate equation:

$$\frac{dN_w}{dt} = \frac{J}{ed} - \frac{N_w}{\bar{\tau}_{w\rightarrow c}} - \frac{N_w}{\tau_{wr}} + \frac{\sum_j N_{c,j}}{\tau_{c\rightarrow w}} \quad (8)$$

where $1/\tau_{a\rightarrow b,j}$ is a relaxation rate of the j-th quantum dot from the state a to the state b. Suffixes w, c, e and g represent the continuous state of the wetting layer, the continuous state, excitation state and ground state of a quantum dot, respectively. An over-bar of $\tau$ means an average value of a relaxation rate. $\tau_{wr}$ is a recombination time of carriers in the wetting layer. $N_w$ is an electron density occupying the continuous state in the wetting layer, and $N_{a,j}$ is an electron density occupying the state a of the j-th quantum dot.

The rate equation of the continuous level Nc$_j$ of the j-th quantum dot 34C$_j$ is given by:

$$\frac{dN_{c,j}}{dt} = \quad (9)$$

$$\frac{G_j N_w}{\tau_{w\rightarrow c,j}} + \frac{N_j}{\tau_{g\rightarrow c,j}} + \frac{N_{e,j}}{\tau_{e\rightarrow c,j}} - \frac{N_{c,j}}{\tau_{c\rightarrow g,j}} - \frac{N_{c,j}}{\tau_{c\rightarrow e,j}} - \frac{N_{c,j}}{\tau_{c\rightarrow w}} - \frac{N_{c,j}}{\tau_{cr}}$$

where $N_j$ is an electron density occupying the ground state of the j-th quantum dot. $\tau_{cr}$ is a recombination time of carriers occupying the continuous state of a quantum dot.

The rate equation of the excitation level Ne$_j$ of the j-th quantum dot 34C$_j$ is given by:

$$\frac{dN_{e,j}}{dt} = \frac{N_{c,j}}{\tau_{c\rightarrow e,j}} + \frac{N_j}{\tau_{g\rightarrow e,j}} - \frac{N_{e,j}}{\tau_{er}} - \frac{N_{e,j}}{\tau_{e\rightarrow c,j}} - \frac{N_{e,j}}{\tau_{e\rightarrow g,j}} \quad (10)$$

where $\tau_{er}$ is a recombination time of carriers occupying the excitation state of a quantum dot.

The rate equation of the ground state N$_j$ of the j-th quantum dot 34C$_j$ is given by:

$$\frac{\partial N_j}{\partial T} = \frac{N_{j0} - N_j}{\tau_{eff,j}} - \Gamma_n \sum_m \bar{g}_{mn}(N_j) S_{mn}(z, T) \quad (11)$$

where the suffix m is an index indicating the frequency of light, and n is an index indicating the lateral mode (an electromagnetic field distribution in the plane vertical to the propagation direction of light) of the optical wave guide.

In the rate equation (11), $N_{j0}$ is given by:

$$N_{j0} = \left[\frac{N_{c,j}}{\tau_{c\rightarrow g,0}} + \frac{N_{e,j}}{\tau_{e\rightarrow g,0}}\right]\tau_{eff,j} \quad (12)$$

$$\tau_{eff,j}^{-1} = \frac{N_{c,j}}{2N_D G_j \tau_{c\rightarrow g,0}} + \frac{N_{e,j}}{2N_D G_j \tau_{e\rightarrow g,0}} + \frac{1}{\tau_{g\rightarrow c,j}} + \frac{1}{\tau_{g\rightarrow e,j}} + \frac{1}{\tau_r}$$

The suffix 0 of the relaxation time $\tau$ in the equation (12) means the relaxation time when the carrier density is 0. The propagation equation of an optical pulse $S_{mn}(z, T)$ is given by:

$$\frac{\partial S_{mn}(z, T)}{\partial z} = \left[\Gamma_n \sum_j \bar{g}_{mn}(N_j) - \alpha_{loss}\right] S_{mn}(z, T) \quad (13)$$

In the above-described rate equations, each relaxation rate is given by the following equation:

$$\tau_{w\rightarrow c,j}^{-1} = (1 - P_{c,j})\tau_{w\rightarrow c,0}^{-1} \quad (14)$$

$$P_{c,j} = \frac{N_{c,j}}{2D_C G_j}$$

$$\tau_{c\rightarrow w}^{-1} = \left(1 - \frac{N_w}{2D_w}\right)\tau_{c\rightarrow w,0}^{-1} \quad (15)$$

$$\tau_{w\rightarrow c}^{-1} = \sum_j (1 - P_{c,j}) G_j \tau_{w\rightarrow c,0}^{-1} \quad (16)$$

$$\tau_{c\rightarrow g,j}^{-1} = (1 - P_j)\tau_{c\rightarrow g,0}^{-1} \quad (17)$$

$$P_j = \frac{N_j}{2N_D G_j}$$

$$\tau_{g\rightarrow c,j}^{-1} = (1 - P_{c,j})\tau_{g\rightarrow c,0}^{-1} \quad (18)$$

$$\tau_{c\rightarrow e,j}^{-1} = (1 - P_{e,j})\tau_{c\rightarrow e,0}^{-1} \quad (19)$$

$$P_{e,j} = \frac{N_{e,j}}{2D_e G_j}$$

$$\tau_{e\rightarrow c,j}^{-1} = (1 - P_{c,j})\tau_{e\rightarrow c,0}^{-1} \quad (20)$$

$$\tau_{e\rightarrow g,j}^{-1} = (1 - P_j)\tau_{e\rightarrow g,0}^{-1} \quad (21)$$

$$\tau_{g\rightarrow e,j}^{-1} = (1 - P_{e,j})\tau_{g\rightarrow e,0}^{-1} \quad (22)$$

where $D_w$ is the number of states per unit area of the wetting layer, $D_c$ is the number of states per unit area of the continuous state of a quantum dot, $D_e$ is the number of excitation states per unit area, and $N_D$ is a density of quantum dots.

By using the theoretical equations described above, the characteristics of the semiconductor optical amplifier shown in FIG. 3 were calculated. The following parameters were used for the calculation:

$\tau_{c\rightarrow g,0} = \tau_{e\rightarrow g,0} = \tau_{c\rightarrow e,0} = 10$ ps $\tau_{w\rightarrow c,0} = 1$ ps $\tau_{g\rightarrow c,0} = 202$ ps $\tau_{g\rightarrow e,0} = 27$ ps $\tau_{e\rightarrow c,0} = 74$ ps $\tau_{c\rightarrow w,0} = \infty$ $N_D = 5 \times 10^{10}$ $cm^{-2}$ $D_w = 40 N_D$ $D_c = 20N_D$ $D_e = 6N_D$ $\Gamma = 15\%$ \hfill (23)

The relaxation time was calculated based upon the theoretical calculation described in A. V. Uskov, F. Adler, H. Schweizer, and M. H. Pikuhn, J. Appl. Phys. 81 (1997) 7895.

Figure 5:
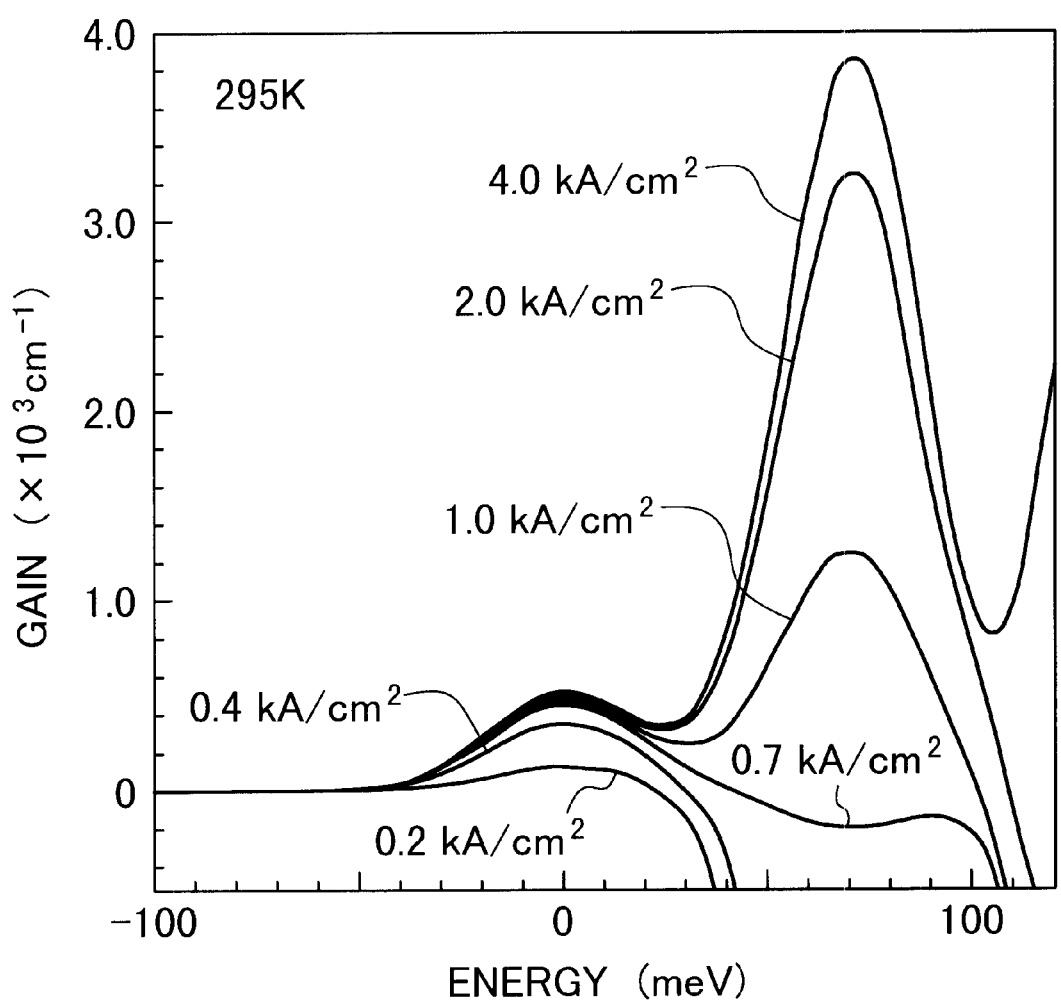
FIG. 5 is a graph showing gain spectra of the semiconductor optical amplifier of the first embodiment.

FIG. 5 shows the dependency of gain spectra of the semiconductor optical amplifier of the first embodiment upon current densities. The abscissa represents the energy of incidence light as a relative value using as 0 meV the energy corresponding to the optical transition wavelength of a carrier in the ground state, and the ordinate represents the gain in the unit of "$cm^{-1}$". The peaks of gains appear at positions corresponding to the optical transition wavelengths in the ground state and excitation state. In the following description, it is assumed that the wavelength of incident light coincides with the optical transition wavelength in the ground state.

Figure 6:
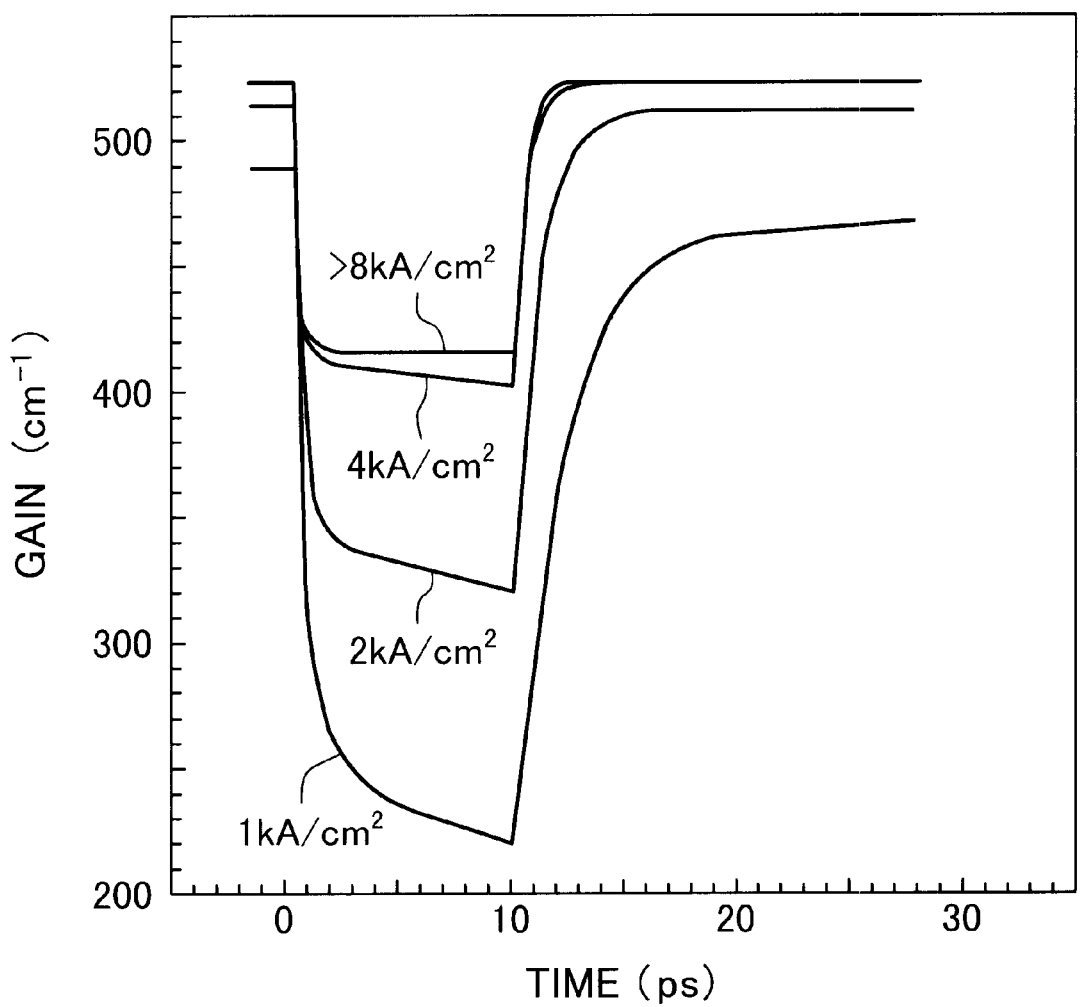
FIG. 6 is a graph showing a change in gains with time when an optical pulse is input to the semiconductor optical amplifier of the first embodiment.
Figure 18:
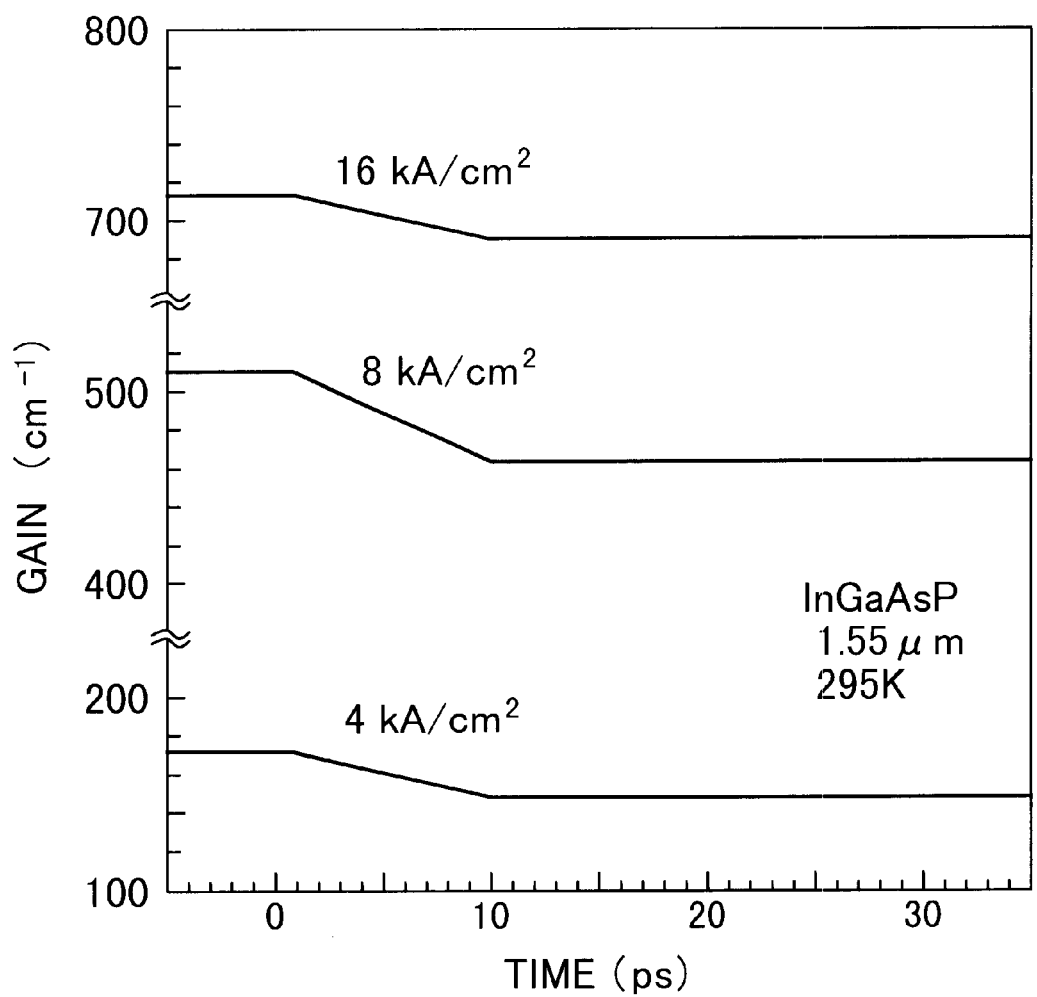
FIG. 18 is a graph showing a change in gains with time when an optical pulse is input to a conventional semiconductor optical amplifier.

FIG. 6 shows a change in gains with time when an optical pulse having a pulse width of 10 ps and a peak power of 40 mW is input to the semiconductor optical amplifier of the first embodiment. The abscissa represents a lapse time from when the optical pulse is input, in the unit of "ps", and the ordinate represents the gain in the unit of "$cm^{-1}$". FIG. 6 corresponds to FIG. 18 showing the gain change characteristics of a conventional semiconductor optical amplifier.

As shown in FIG. 6, as the optical pulse is input to the semiconductor optical amplifier, the gain lowers rapidly, and after the optical pulse passes through the semiconductor optical amplifier, the gain is quickly recovered. The response time of the gain is about 1 ps. It can be understood from the comparison between FIGS. 6 and 18 that the response time of the gain of the semiconductor optical amplifier of the first embodiment is considerably shorter than that of the conventional semiconductor optical amplifier.

Figure 7:
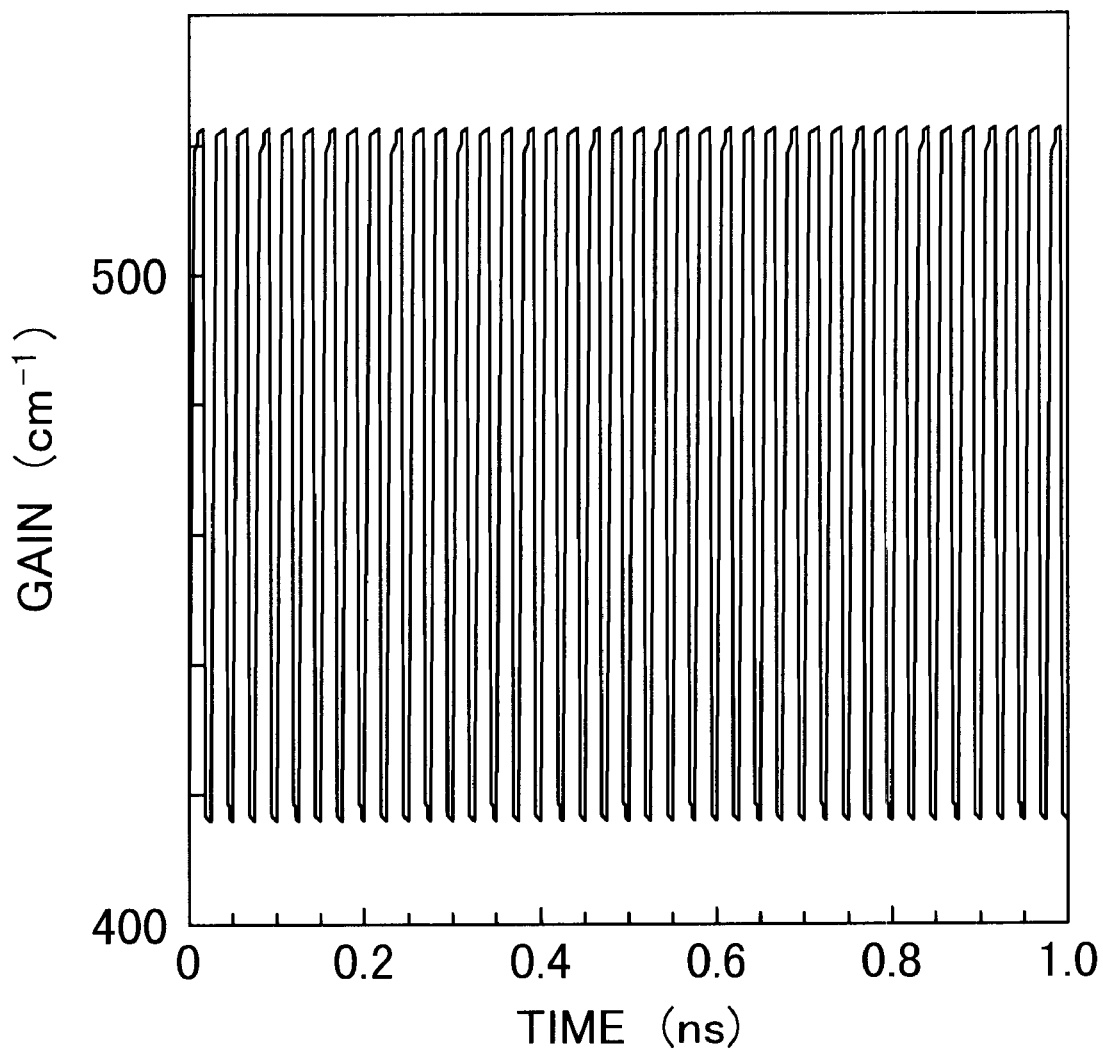
FIG. 7 is a graph showing a change in the gain with time when an optical pulse train is input to the semiconductor optical amplifier of the first embodiment.

FIG. 7 shows the response characteristics of the gain of the semiconductor optical amplifier of the first embodiment when an optical signal having a pulse repetition frequency of 40 Gb/s is input under the condition of the current density of 16 kA/$cm^2$. The abscissa represents the lapse time in the unit of "ns" and the ordinate represents the gain in the unit of "$cm^{-1}$". FIG. 7 corresponds to FIG. 19 showing the gain response characteristics of the conventional semiconductor optical amplifier.

Figure 19:
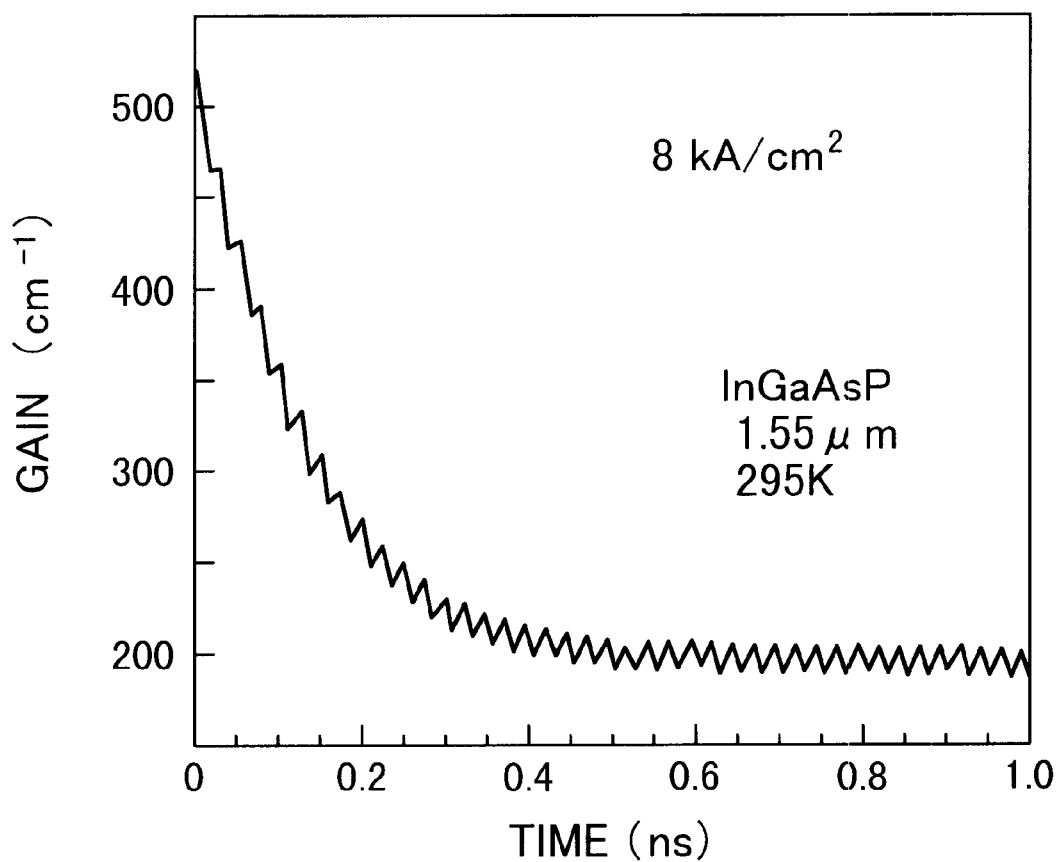
FIG. 19 is a graph showing a change in the gain with time when an optical pulse train is input to a conventional semiconductor optical amplifier.

As shown in FIG. 19, the gain change of the conventional semiconductor optical amplifier cannot follow a change in an optical signal. In contrast, in the case of the semiconductor optical amplifier of the first embodiment, each pulse is accompanied with a gain saturation and the gain change follows a change in the optical signal.

Figure 8:
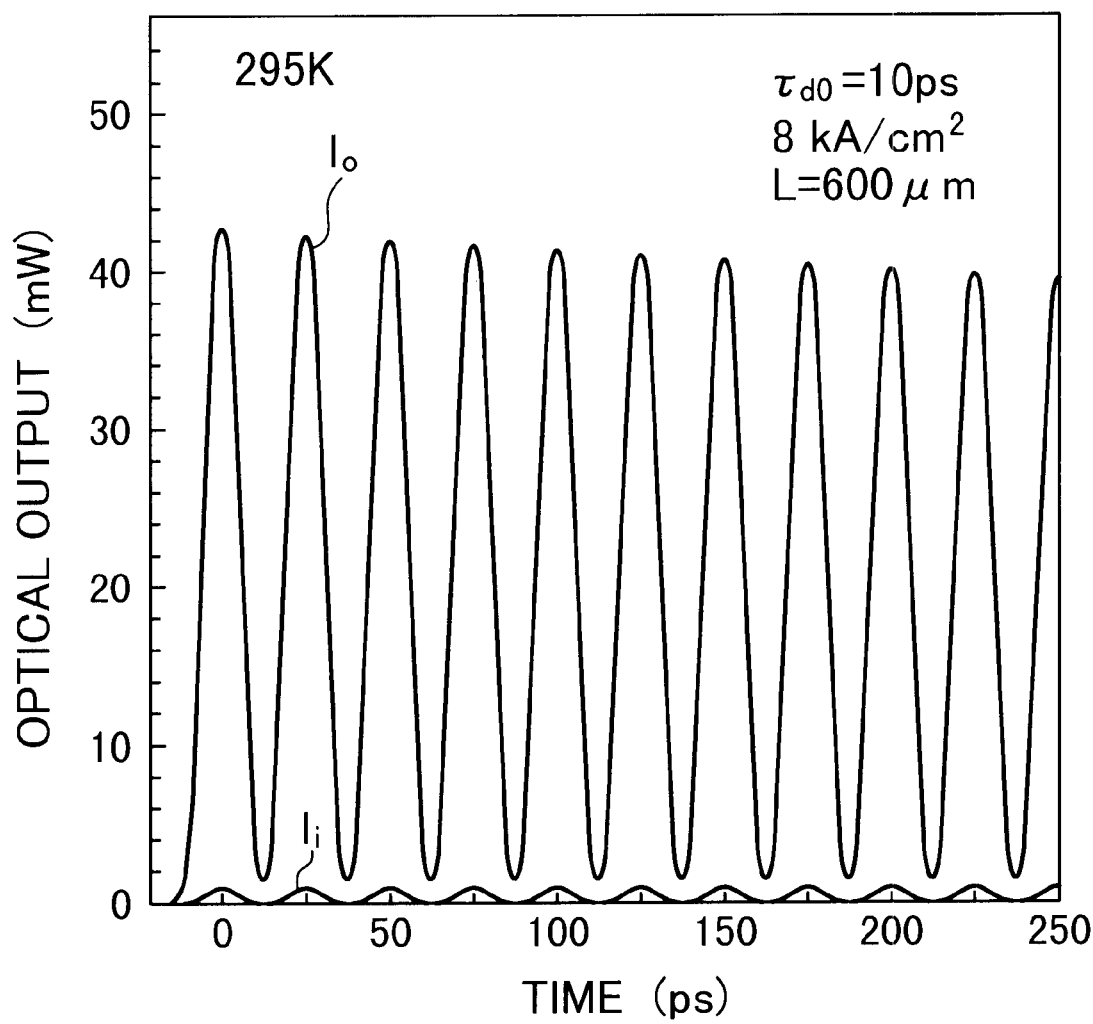
FIG. 8 is a graph showing light intensities of input and output signals when an optical pulse train is input to the semiconductor optical amplifier of the first embodiment.

FIG. 8 shows a change in the intensities of input and output optical signals with time when an optical signal having a pulse width of 10 ps, a bit rate of 40 Gb/s and a peak power of 1 mW is input to the semiconductor optical amplifier of the first embodiment, under a condition of a current density of 8 kA/$cm^2$. The abscissa represents a lapse time in the unit of "ps" and the ordinate represents a light intensity in the unit of "mW". The length of the semiconductor optical amplifier was 600 μm in the light propagation direction. Curves li and lo indicate the light intensities of the input and output optical signals, respectively.

Figure 20:
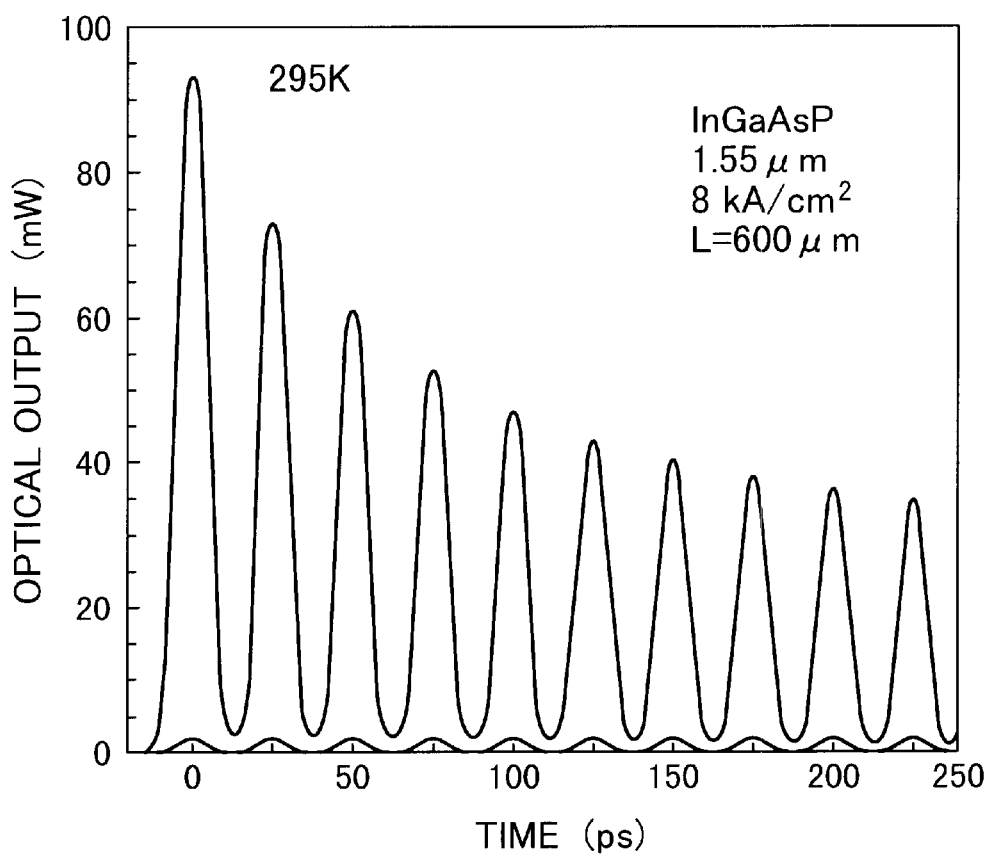
FIG. 20 is a graph showing light intensities of input and output signals when an optical pulse train is input to a conventional semiconductor optical amplifier.

In the conventional semiconductor optical amplifier, as shown in FIG. 20 the peak powers of pulses of the output optical signal are not stable because of a slow response time of the gain. In contrast, in the semiconductor optical amplifier of the first embodiment, as shown in FIG. 8 the peak powers of pulses of the output optical signal are almost uniform. Transmission hard to generate errors becomes possible. If the current density is increased, it can be expected that the peak powers of pulses of the output optical signal can be made more uniform.

Next, with reference to FIG. 9, a difference between the operation principles of a conventional semiconductor optical amplifier and the semiconductor optical amplifier of the first embodiment will be described.

Figure 9:
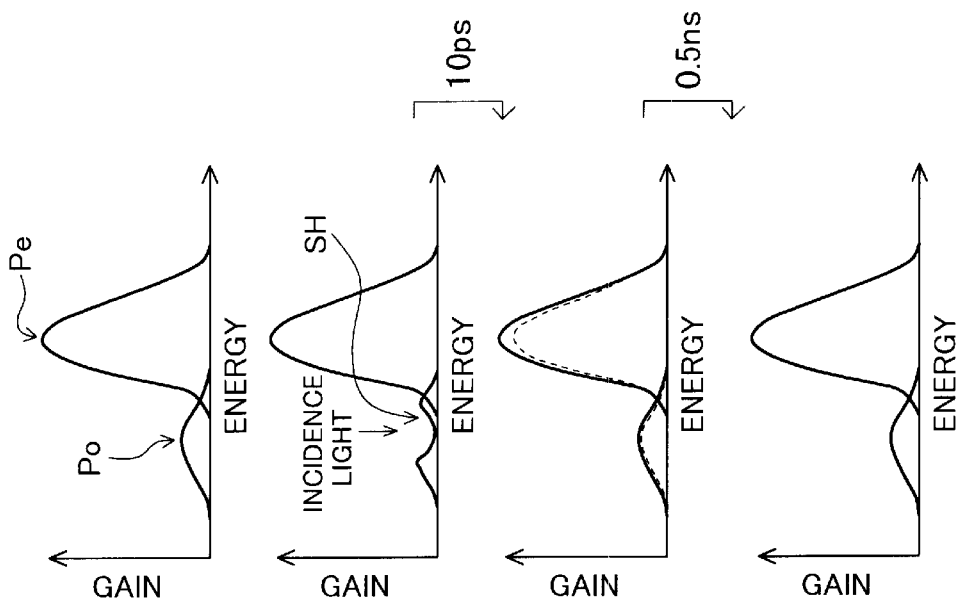
FIG. 9 is graphs showing gain spectra illustrating the operation principles of a conventional semiconductor optical amplifier and the semiconductor optical amplifier of the first embodiment.
Figure 9:
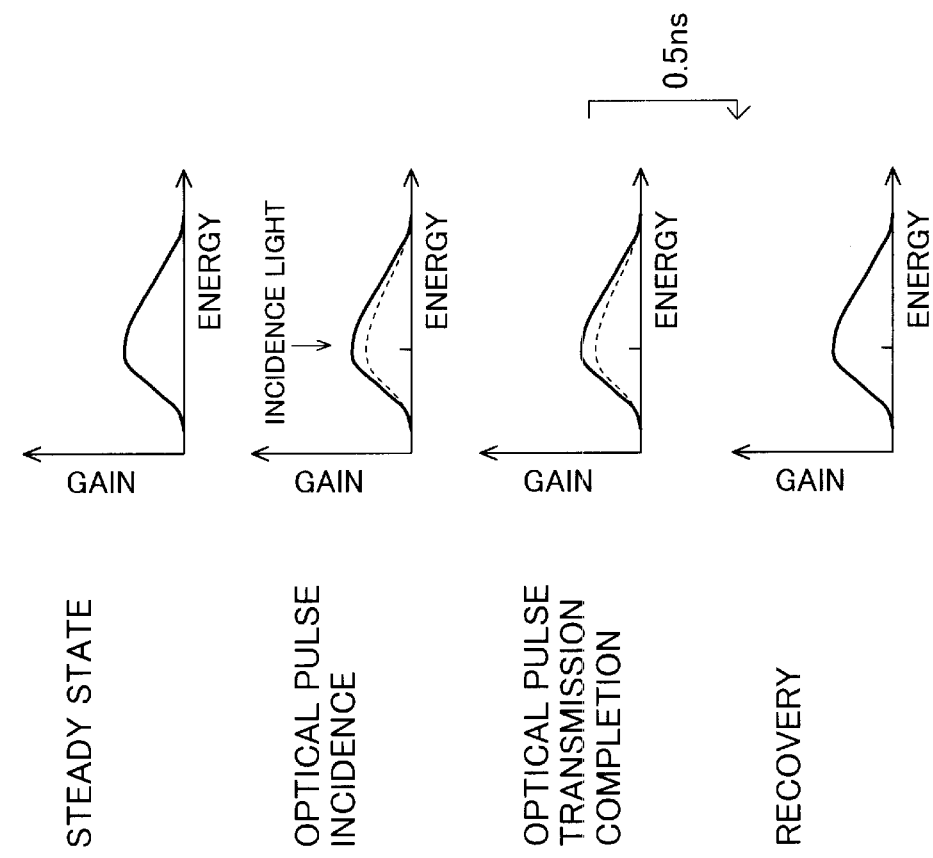

Graphs in the left side column shown in FIG. 9 show gain spectra of a conventional semiconductor optical amplifier, and graphs in the right side column show gain spectra of the semiconductor optical amplifier of the first embodiment. The graphs in the uppermost row show gain spectra in the steady state, the graphs in the second row show gain spectra immediately after an optical pulse becomes incident, the graphs in the third row show gain spectra after the optical pulse passes through the semiconductor optical amplifiers, and the graphs in the fourth row show gain spectra after the original gains are recovered.

The energy levels of electrons in the active layer of the conventional semiconductor optical amplifier distribute continuously. Therefore, the gain spectrum has a broad shape including the energy corresponding to the band gap of the active layer. When an optical pulse becomes incident, the density of electrons occupying the energy state corresponding to the incidence light is lowered by induced emission so that the gain corresponding to the energy lowers.

However, since the energy levels in the active layer distribute continuously, electrons are supplied instantly to the energy level having the lowered electron density from another energy level. The relaxation time of electrons occupying the continuous state is very short, about 100 fs. Therefore, a spectrum hole does not appear in the gain spectrum. If the power of the incidence light is about several tens mW as used by general optical transmission, the number of electrons reduced by induced emission is small so that the overall gain lowers little and the gain saturation does not occur.

Electrons reduced by induced emission are replenished with carriers injected from the electrode. The gain is not recovered until carriers are replenished. Therefore, the gain is maintained lowered immediately after the optical pulse passes through the semiconductor optical amplifier. When the electron density recovers the value in the steady state, the gain is also recovered. The time to recover the gain is about 0.5 ns.

In the case of the semiconductor optical amplifier of the first embodiment, peaks $P_0$ and $P_e$ corresponding to the ground state and excitation state of a quantum dot appear in the gain spectrum. When an optical pulse corresponding to the energy in the ground state becomes incident, the electron density in the ground state is lowered by induced emission. It takes a relaxation time of about 10 ps until reduced electrons are replenished from the excitation state. A spectrum hole SH therefore appears in the gain spectrum at the position corresponding to the energy of the incidence light.

When the optical pulse passes through the semiconductor optical amplifier, the gain corresponding to the energy in the ground state is recovered by relaxation from the excitation state and continuous state. The time to recover the gain is about 10 ps. As electrons transit from the excitation state and continuous state to the ground state, the electron densities in the excitation state and continuous state lower. The lowered electron density is replenished with carriers injected from the electrode. Therefore, the gain corresponding to the energy in the excitation state recovers the value in the steady state in about 0.5 ns.

It takes a relatively long time to recover the electron density from the excitation state and continuous state. The numbers of excitation states and continuous states are larger than the number of ground states. If the sufficient number of electrons are injected beforehand in these states, the delay in recovering the electron state from the excitation state and continuous state hardly affects the gain corresponding to the energy in the ground state.

As described above, in the semiconductor optical amplifier of the first embodiment, since the gain saturation occurs upon generation of the spectrum hole, the response time is very short. The gain is recovered by replenishment of electrons from the excitation state and continuous state to the ground state. The gain recovery time is also short.

Next, a 2R element according to the second embodiment of the invention will be described with reference to FIG. 10.

Figure 10:
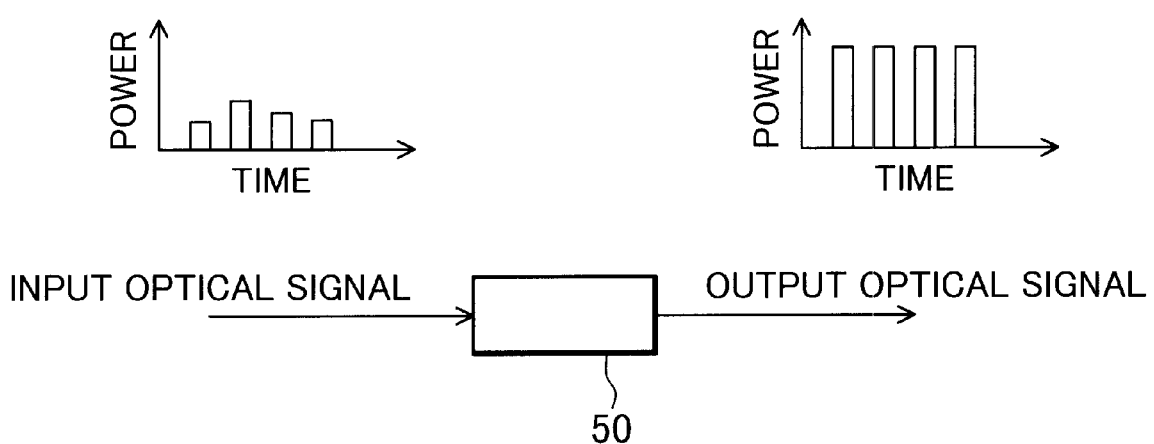
FIG. 10 is a block diagram showing a semiconductor optical amplifier according to a second embodiment.

As shown in FIG. 10, an optical signal is input to a semiconductor optical amplifier 50 having the structure similar to the semiconductor optical amplifier of the first embodiment. The peak powers of pulses of the input optical signal are not uniform. As the semiconductor optical amplifier 50 enters the gain saturation, the peak powers of pulses of an output optical signal become uniform. As described with reference to FIG. 6, since the time during the gain saturation is about 1 ps, it is possible to amplify and reshape the optical signal at 2 Gb/s or higher, although the conventional semiconductor optical amplifier cannot amplify and reshape such an optical signal. The 2R element of the second embodiment is suitable for amplifying and reshaping an optical signal at a bit rate of 10 Gb/s or higher, particularly at a bit rate of 40 Gb/s or higher.

Next, with reference to FIG. 11, a wavelength converter unit according to the third embodiment of the invention will be described.

Figure 11:
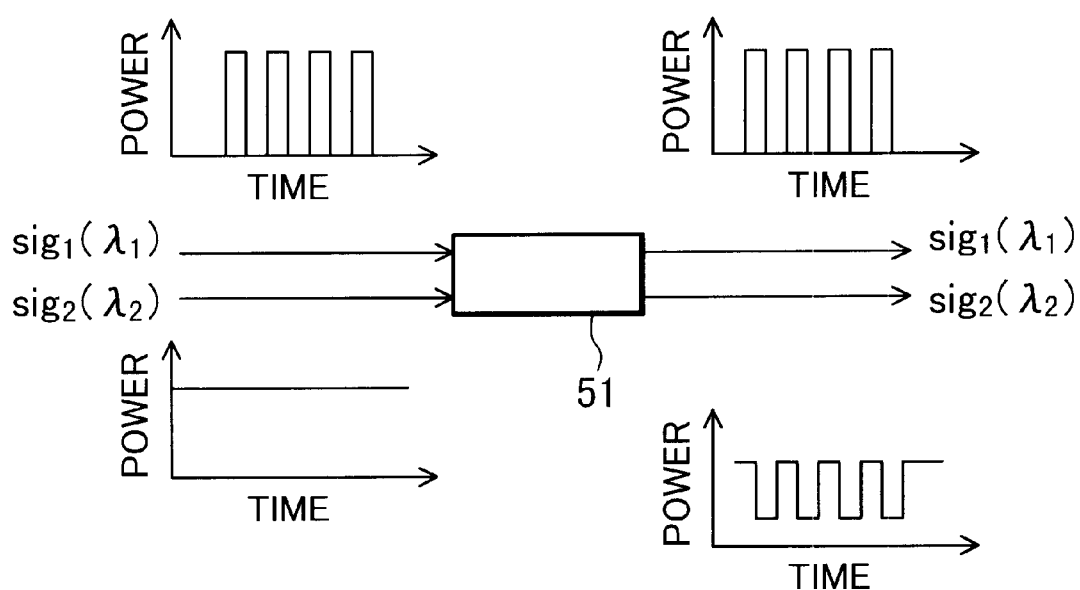
FIG. 11 is a block diagram showing a wavelength converter unit according to a third embodiment.
Figure 17:
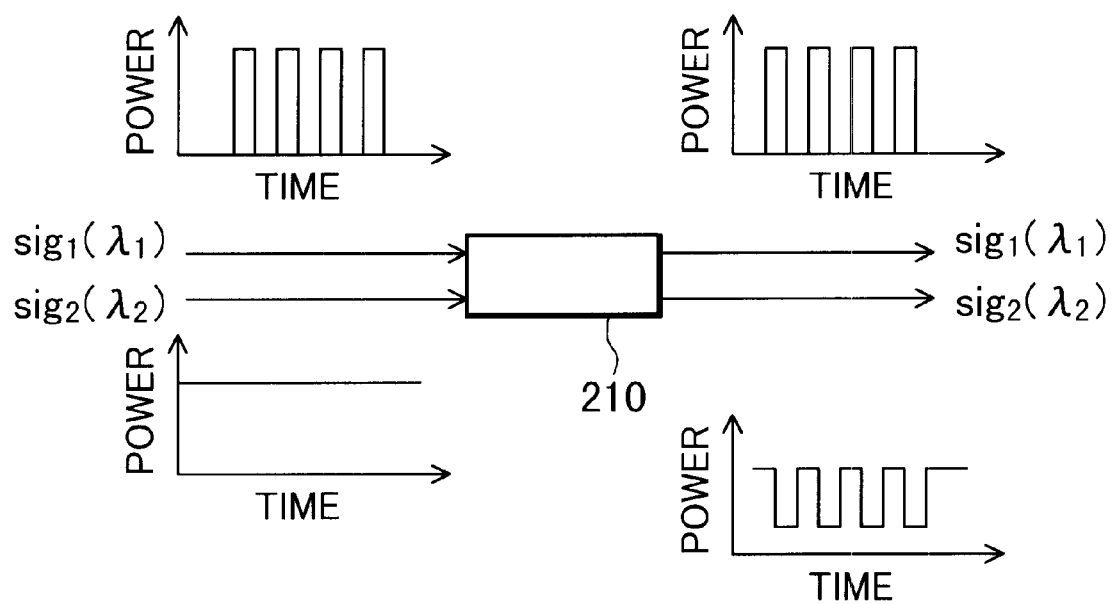
FIG. 17 is a block diagram of a conventional wavelength converter unit.

As shown in FIG. 11, an optical signal $sig_1$ having a wavelength $\lambda_1$ and an optical signal $sig_2$ having a wavelength $\lambda_2$ are input to a semiconductor optical amplifier 51 having the structure similar to that of the first embodiment. As compared to the conventional wavelength converter unit shown in FIG. 17, the wavelength converter unit of the third embodiment has the semiconductor optical amplifier 51 having the structure similar to that of the first embodiment, instead of using the semiconductor optical amplifier 210 of the conventional wavelength converter unit. The other fundamental structures are not changed.

As the optical signal $sig_1$ is input to the semiconductor optical amplifier 51, the spectrum hole shown in FIG. 9 is formed. The spread of the spectrum hole in the energy space extends to the energy of the optical signal $sig_2$ having the wavelength $\lambda_2$. Therefore, when the optical signal $sig_1$ is input, the gain of the optical signal $sig_2$ lowers. The output intensity of the optical signal $sig_2$ therefore lowers so that the inverted waveform of the optical signal $sig_1$ can be obtained.

In the third embodiment, the semiconductor optical amplifier 51 having the structure similar to the first embodiment with a high gain response speed is used. It is therefore possible to convert the wavelength of an optical signal at a bit rate of 2 Gb/s or higher, although the conventional wavelength converter unit cannot convert the waveform of such an optical signal. The wavelength converter unit of the third embodiment is suitable for the wavelength conversion of an optical signal at a bit rate of 10 Gb/s or higher, or particularly at a bit rate of 40 Gb/s or higher. In order to make the spectrum hole of the optical signal $sig_1$ cover the energy of the optical signal $sig_2$ having the wavelength $\lambda_2$, it is necessary that an energy difference between optical signals having the wavelengths $\lambda_1$ and $\lambda_2$ is smaller than the homogeneous broadening of the gains of quantum dots (about 10 to 20 meV at a room temperature).

Next, with reference to FIG. 12, an optical signal separator unit (demultiplexer) according to the fourth embodiment of the invention will be described.

Figure 12:
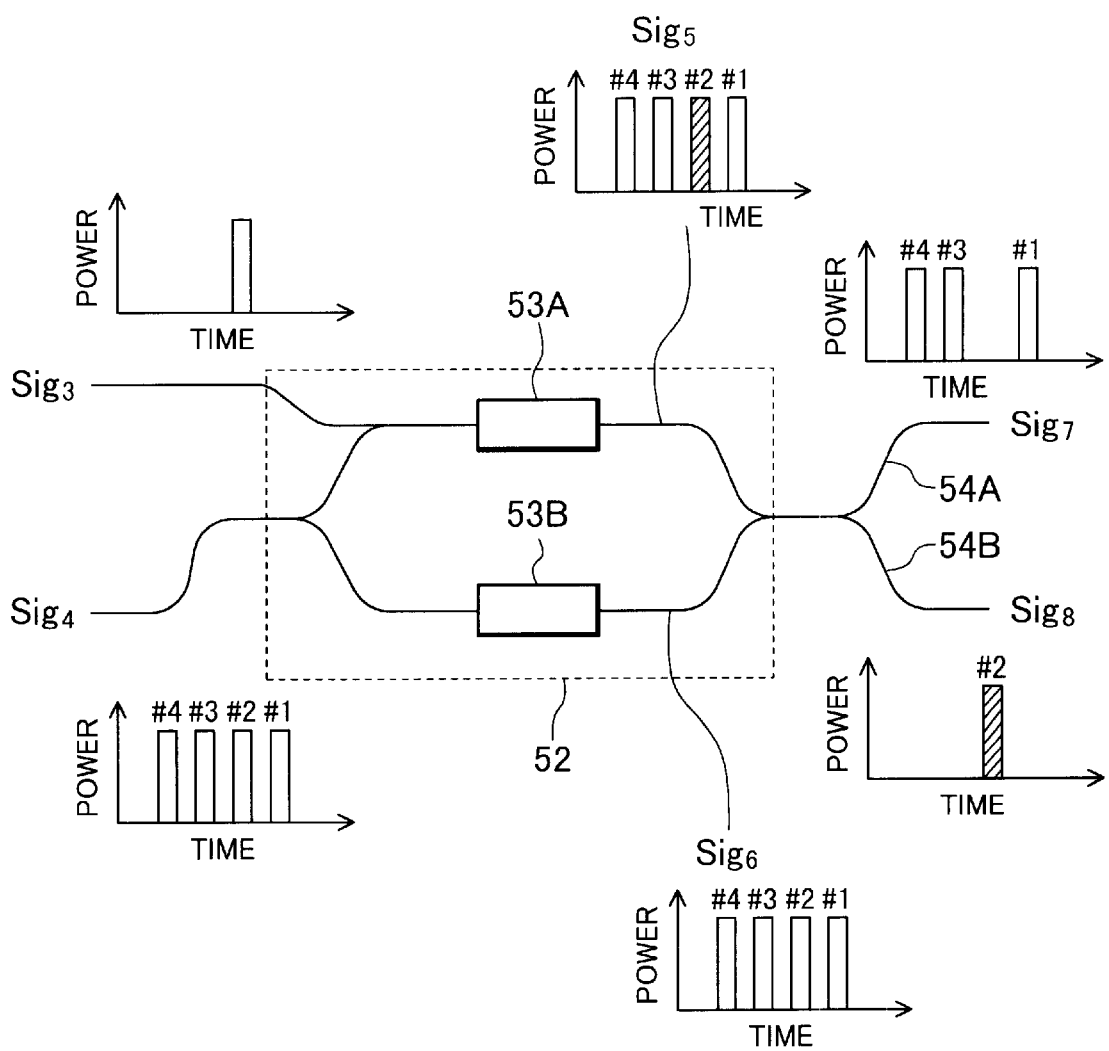
FIG. 12 is a block diagram showing an optical signal separator unit according to a fourth embodiment.
Figure 21A:
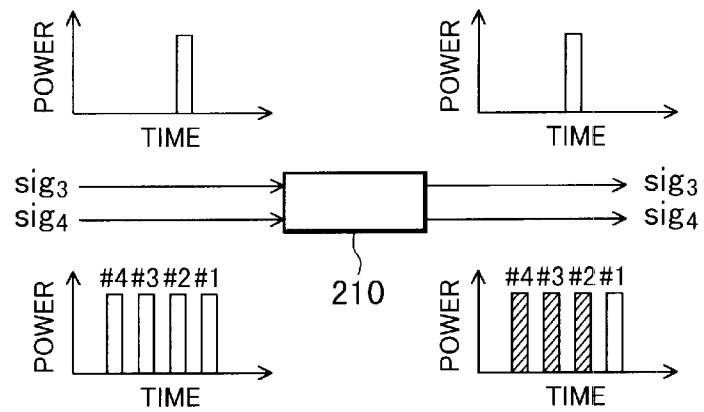
FIGS. 21A and 21B are block diagrams showing a conventional optical signal separator unit.
Figure 21B:
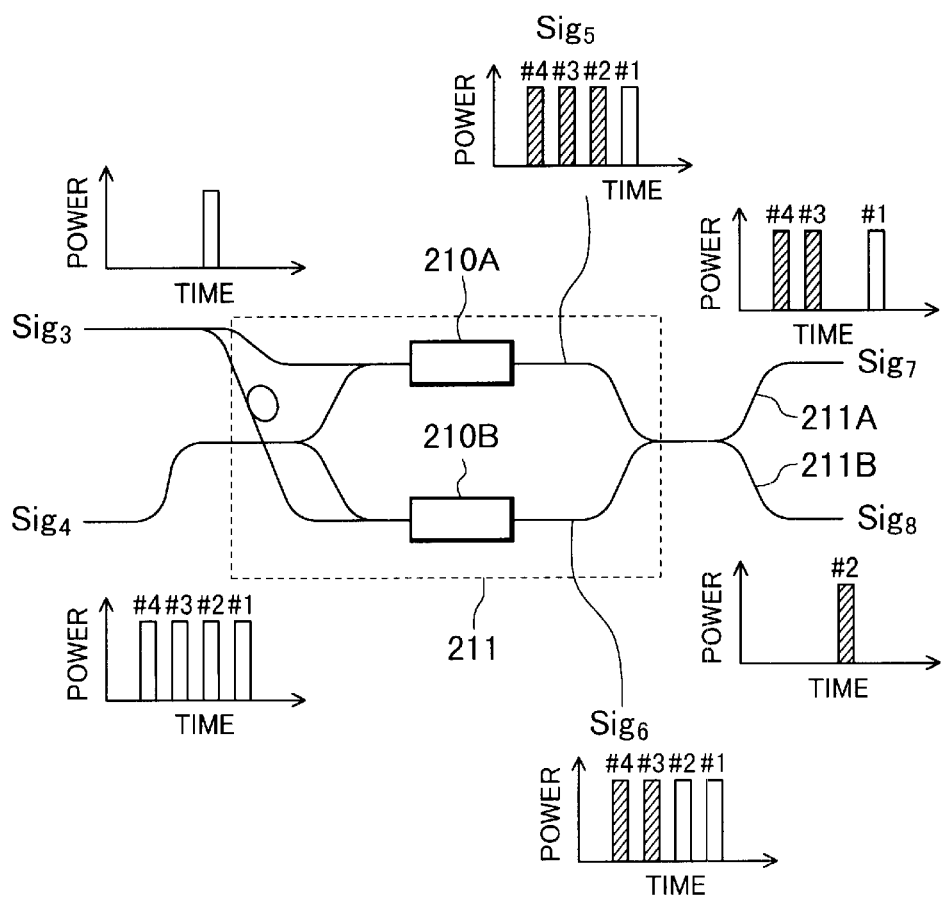

FIG. 12 is a block diagram showing the optical signal separator unit of the fourth embodiment. As compared to the conventional optical signal separator unit shown in FIG. 21, the optical signal separator unit of the fourth embodiment has first and second semiconductor optical amplifiers 53A and 53B having the structure similar to the first embodiment, instead of using the first and second semiconductor optical amplifiers 210A and 210B.

The first and second semiconductor optical amplifiers 53A and 53B are inserted into two optical paths of a Mach-Zehnder type interferometer 52. In the conventional optical signal separator unit shown in FIG. 21, the optical control signal $sig_3$ is input not only to the first semiconductor optical amplifier 210A but also to the second semiconductor optical amplifier 210B via the delay circuit. This structure is to compensate for the low response characteristics of the gain of the semiconductor optical amplifiers, as described earlier.

In the fourth embodiment, since the semiconductor optical amplifiers 53A and 53B having excellent gain response characteristics are used, it is not necessary to input the control signal $sig_3$ to the second semiconductor optical amplifier 53B. The other structures of the optical signal separator unit of the fourth embodiment are similar to the conventional optical signal separator unit shown in FIG. 21. The control signal $sig_3$ and optical signal $sig_4$ are similar to those shown in FIG. 21.

The phase of the channel #2 pulse of an optical signal $sig_5$ output from the first semiconductor optical amplifier 53A is shifted by $\pi$. Since the response speed of the first semiconductor optical amplifier 53A is fast, the pulses of the channels #3 and #4 are not influenced by the pulse of the control signal $sig_3$. Therefore, the phases of the pulses of the channels #3 and #4 are not shifted. The phase of each pulse of an optical signal $sig_6$ output from the second semiconductor optical amplifier 53B is not shifted. Because of interference between the optical signals $sig_5$ and $sig_6$, pulses of the channels #1, #3 and #4 are output from one output optical wave guide, and a pulse of the channel #2 is output from the other output optical wave guide.

In the fourth embodiment, the optical control signal $sig_3$ is input only to the first semiconductor optical amplifier 53A so that the structure of the unit can be simplified and the operation point can be adjusted easily. The optical signal separator unit of the fourth embodiment can separate, for example, a desired optical signal having the bit rate of 40 Gb/s from an optical signal having a bit rate of 160 Gb/s obtained by time-division multiplexing four optical signals having a bit rate of 40 Gb/s.

Next, with reference to FIGS. 13A and 13B, a 2R element according to the fifth embodiment of the invention will be described.

Figure 13A:
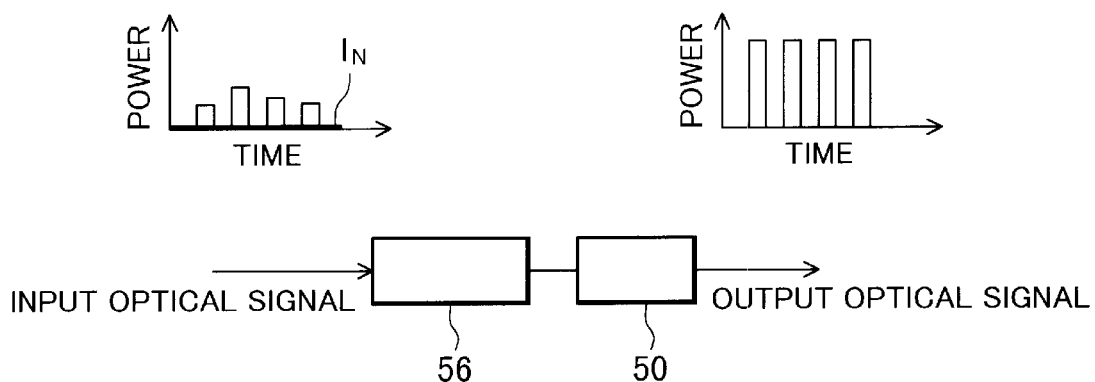
FIGS. 13A and 13B are a block diagram showing an optical signal amplifying and reshaping unit according to a fifth embodiment and a graph showing the input/output characteristics of an optical absorbing and saturating element used by the optical signal amplifying and reshaping unit.

FIG. 13A is a block diagram showing the 2R element of the fifth embodiment. An optical absorbing and saturating element 56 is inserted at the preceding stage of a semiconductor optical amplifier 50 having the structure similar to the second embodiment shown in FIG. 10. An optical signal is input to the optical absorbing and saturating element 56, and an optical signal output from the element 56 is input to the semiconductor optical amplifier 50. For example, the optical absorbing and saturating element 56 is made of an optical wave guide having an active layer made of semiconductor.

Figure 13B:
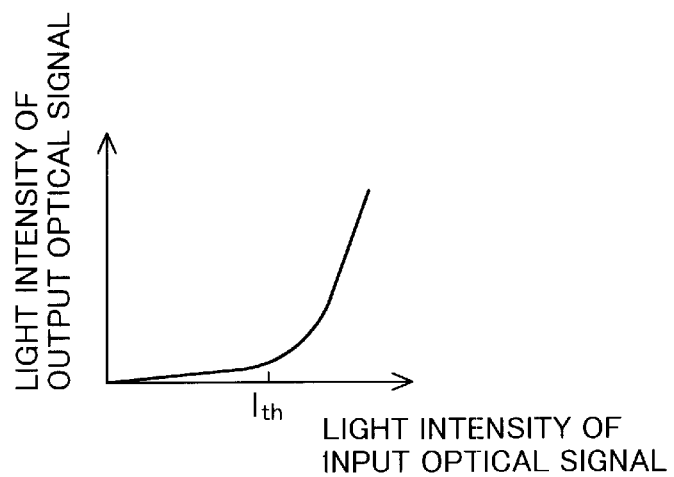

FIG. 13B shows the input/output characteristics of the optical absorbing and saturating element 56. The abscissa represents the light intensity of an input optical signal and the ordinate represents the light intensity of an output optical signal. If the intensity of the input optical signal is equal to or lower than a threshold value $I_{th}$, most of the input optical signal is absorbed and the light intensity of the output optical signal is nearly zero. If the intensity of the input optical signal exceeds the threshold value $I_{th}$, the light intensity of the output optical signal increases greatly. Namely, the optical absorbing and saturating element 56 absorbs the input optical signal component having the intensity equal to or lower than the threshold value, and allows the component through, having the intensity higher than the threshold value.

Generally, an input optical signal contains background noises $I_N$. The intensity of the background noises $I_N$ is equal to or lower than the threshold value $I_{th}$ of the optical absorbing and saturating element 56. Since an optical signal with the background noises $I_N$ being removed is input to the semiconductor optical amplifier 50, the S/N ratio of an amplified and reshaped output optical signal can be made high.

Figure 14:
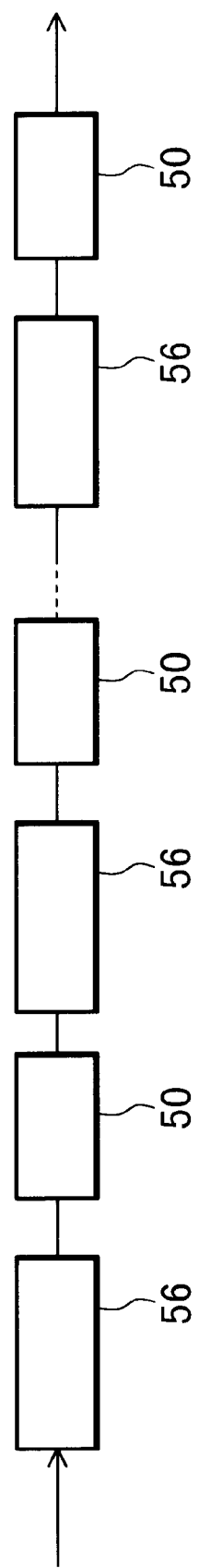
FIG. 14 is a block diagram showing an optical signal amplifying and reshaping unit according to a modification of the fifth embodiment.
Figure 15:
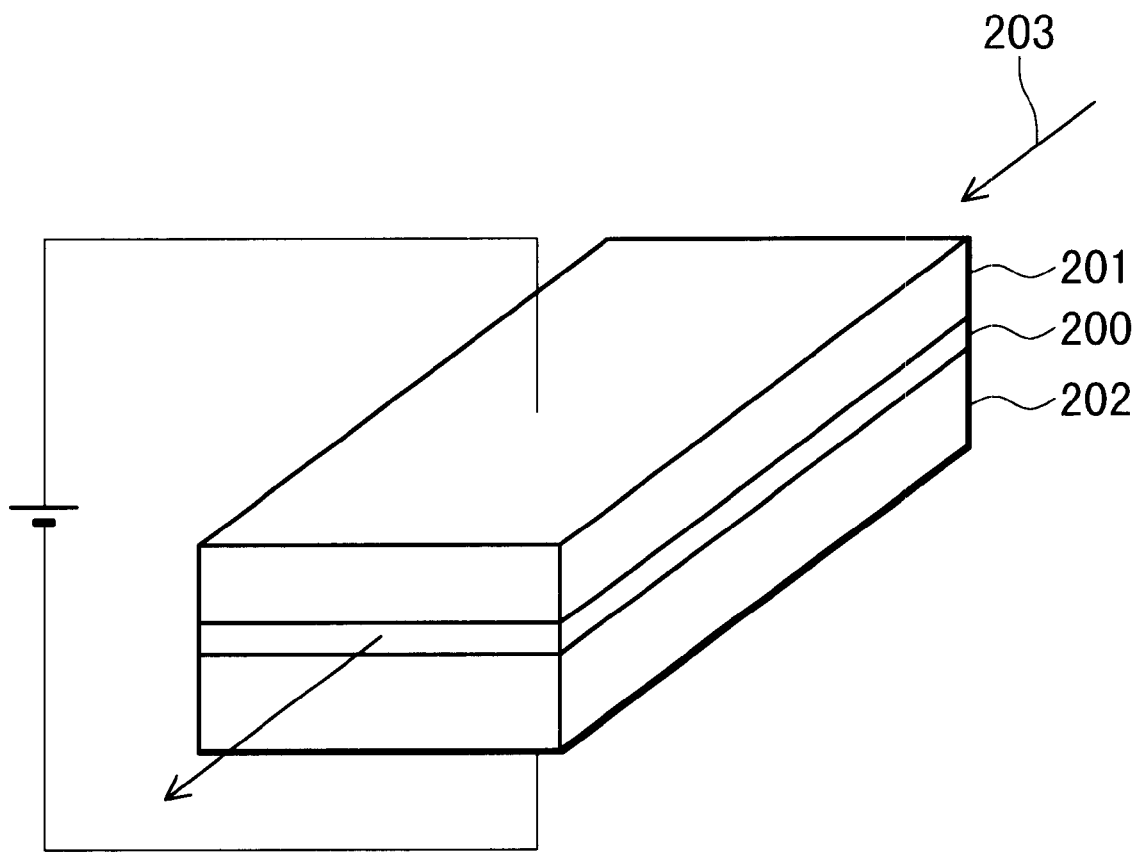
FIG. 15 is a perspective view of a conventional semiconductor optical amplifier.
Figure 16:
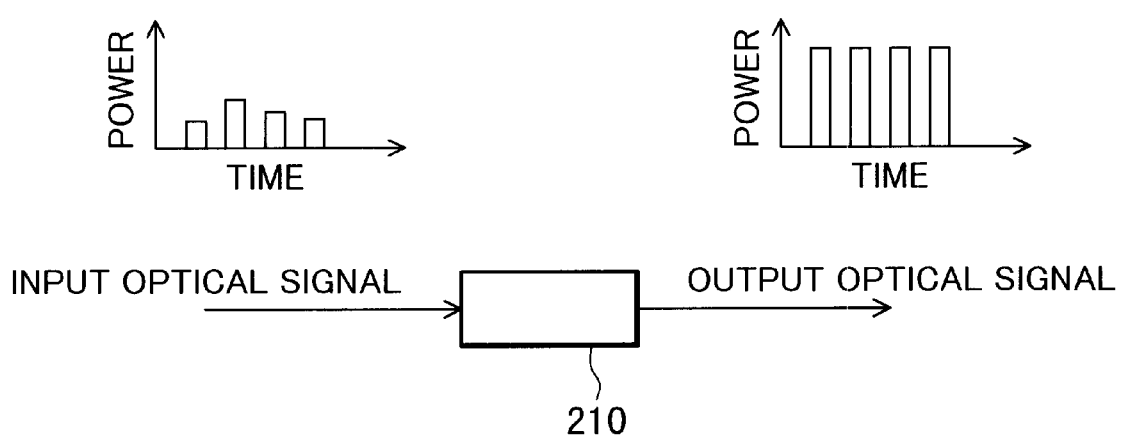
FIG. 16 is a block diagram of a conventional semiconductor optical amplifier.

As shown in FIG. 14, a plurality of optical absorbing and saturating elements 56 and semiconductor optical amplifiers 50 may be connected in tandem. A tandem connection of a plurality of elements can improve the waveform reshaping effect. Although the optical absorbing and saturating elements 56 and semiconductor optical amplifiers 50 are not required to be connected alternately, the alternate connection is expected to improve the waveform reshaping effect.

The present invention has been described in connection with the preferred embodiments. The invention is not limited only to the above embodiments. It is apparent that various modifications, improvements, combinations, and the like can be made by those skilled in the art.

What I claim are:

1. An optical signal processing method, comprising the steps of:
   injecting carriers into a plurality of quantum dots by applying a bias voltage to a semiconductor region of a semiconductor optical amplifier, the plurality of quantum dots for three-dimensionally confining carriers being distributed in the semiconductor region; and
   amplifying an optical pulse signal having a bit rate of 2 Gb/s or higher input to the semiconductor optical amplifier by generating induced emission by optical transition of the carriers in the quantum dots.

2. An optical signal processing method according to claim 1, further comprising a step of inputting an optical pulse signal to an optical absorbing and saturating element which absorbs a component of the optical pulse signal having an intensity equal to or lower than a threshold value and allows a component through, having an intensity higher than the threshold value, and outputting an optical pulse signal, a part of whose component was removed by the optical absorbing and saturating element,
   wherein in said step of amplifying the optical pulse signal, the optical pulse signal output from the optical absorbing and saturating element is input to the semiconductor optical amplifier.

3. An optical signal processing method, comprising the steps of:
   injecting carriers into a plurality of quantum dots by applying a bias voltage to a semiconductor region of a semiconductor optical amplifier, the plurality of quantum dots for three-dimensionally confining carriers being distributed in the semiconductor region; and
   inputting an optical pulse signal having a first wavelength and continuous light having a second wavelength different from the first wavelength to the semiconductor optical amplifier, to make an output waveform of the continuous light change with a waveform of the optical pulse signal by lowering a gain of the semiconductor optical amplifier upon input of an optical pulse of the optical pulse signal.

4. An optical signal processing method, comprising the steps of:
   injecting carriers into a plurality of quantum dots by applying a bias voltage to semiconductor regions of first and second semiconductor optical amplifiers, the plurality of quantum dots for three-dimensionally confining carriers being distributed in each of the semiconductor regions;
   inputting same multiplex signals obtained by time-division multiplexing a plurality of optical pulse signals to both of the first and second semiconductor optical amplifiers and inputting an optical control signal only to the first semiconductor optical amplifier synchronously with a time slot corresponding to one the optical pulse signals constructing the multiplex signal; and
   making the multiplex signals output from the first and second semiconductor optical amplifiers interfere with each other to separate one optical signal from the multiplex signal.

5. An optical signal processing apparatus comprising:
   a semiconductor optical amplifier having a semiconductor region, a plurality of quantum dots for three-dimensionally confining carriers being distributed in the semiconductor region; and
   an optical input device for inputting an optical pulse signal having a first wavelength and continuous light having a second wavelength different from the first wavelength, to said semiconductor optical amplifier.

6. An optical signal processing apparatus according to claim 5, wherein a peak power of the optical pulse signal and a power of the continuous light are selected so that when a pulse of the optical pulse signal is input, a gain of the continuous light having the second wavelength is lowered by gain saturation of said semiconductor optical amplifier and an intensity of an output light having the second wavelength is lowered.

7. An optical signal processing apparatus, comprising:
   first and second semiconductor optical amplifiers each having a semiconductor region, a plurality of quantum dots for three-dimensionally confining carriers being distributed in the semiconductor region;
   a first optical unit for inputting same multiplex signals obtained by time-division multiplexing a plurality of optical pulse signals to both of the first and second semiconductor optical amplifiers;
   a second optical unit for inputting an optical control pulse signal only to the first semiconductor optical amplifier synchronously with a time slot corresponding to one of the optical pulse signals constructing the multiplex signal; and
   an interferometer for making multiplex signals output from the first and second semiconductor optical amplifiers interfere with each other to separate one of the optical pulse signals from the multiplex signal.

8. An optical signal processing apparatus, comprising:
   first and second semiconductor optical amplifiers each having a semiconductor region, a plurality of quantum dots for three-dimensionally confining carriers being distributed in the semiconductor region;

a first optical unit for inputting an optical pulse signal to the first and second semiconductor optical amplifiers;

a second optical unit for inputting an optical control pulse signal only to the first semiconductor optical amplifier; and an interferometer for making optical pulse signals output from the first and second semiconductor optical amplifiers interfere with each other to separate an optical pulse from the optical pulse signals, the optical pulse being synchronous with the optical control pulse signal.

9. An optical signal processing apparatus comprising:

an optical absorbing and saturating element for absorbing a component of incident light having an intensity equal to or lower than a threshold value and allowing a component through, having an intensity higher than the threshold value;

a first optical unit for inputting an optical pulse signal to said optical absorbing and saturating element; and a semiconductor optical amplifier having a semiconductor region, an optical pulse signal output from said optical absorbing and saturating element is input to said semiconductor optical amplifier, and a plurality of quantum dots for three-dimensionally confining carriers being distributed in the semiconductor region.

10. An optical signal processing apparatus comprising:

a plurality of optical absorbing and saturating elements each for absorbing a component of incidence light having an intensity equal to or lower than a threshold value and allowing a component through, having an intensity higher than the threshold value;

a plurality of semiconductor optical amplifiers each having a semiconductor region, a plurality of quantum dots for three-dimensionally confining carriers being distributed in the semiconductor region; and optical wave guides for connecting said plurality of optical absorbing and saturating elements and semiconductor optical amplifiers in tandem.

* * * * *